US012684990B2

(12) United States Patent (10) Patent No.: US 12,684,990 B2
Lee et al. (45) Date of Patent: Jul. 14, 2026

(54) DISPLAY DEVICE

(71) Applicant: Samsung Display Co., Ltd., Yongin-si (KR)

(72) Inventors: Kyunghoe Lee, Yongin-si (KR); Cheol-Gon Lee, Yongin-si (KR); Mukyung Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 19/083,224

(22) Filed: Mar. 18, 2025

(65) Prior Publication Data

US 2025/0301877 A1 Sep. 25, 2025

(30) Foreign Application Priority Data

Mar. 20, 2024 (KR) ........................ 10-2024-0038283

(51) Int. Cl.
*H10K 59/40* (2023.01)
*H10K 59/121* (2023.01)
*H10K 59/126* (2023.01)
*H10K 59/131* (2023.01)
*H10D 86/40* (2025.01)
*H10D 86/60* (2025.01)

(52) U.S. Cl.
CPC ......... *H10K 59/40* (2023.02); *H10K 59/1213* (2023.02); *H10K 59/126* (2023.02); *H10K 59/131* (2023.02); *H10D 86/441* (2025.01); *H10D 86/60* (2025.01)

(58) Field of Classification Search
CPC .. H10K 59/40; H10K 59/1213; H10K 59/126; H10K 59/131; H10K 59/65; H10K 59/12; H10K 59/60; H10K 59/95; H10K 59/1216; H10K 65/00; H10K 30/60; H10K 77/111; H10D 86/441; H10D 86/60; H10D 86/425; H10H 29/24; H10H 29/30; H10H 29/49; G06F 3/0412; G09F 9/301; G09G 3/3225
See application file for complete search history.

(56) References Cited

U.S. PATENT DOCUMENTS

| | | | | |
|---|---|---|---|---|
| 10,797,121 B2* | 10/2020 | Lee | ...................... | H10K 59/124 |
| 11,158,258 B2* | 10/2021 | Cha | ...................... | G09G 3/3233 |
| 11,546,984 B1* | 1/2023 | Wong | ...................... | H05K 1/024 |
| 2016/0351093 A1* | 12/2016 | Kim | ...................... | H10K 59/131 |

(Continued)

*Primary Examiner* — Christopher E Leiby

(74) *Attorney, Agent, or Firm* — Womble Bond Dickinson (US) LLP

(57) ABSTRACT

A display device includes: a base layer; a circuit layer including: a buffer layer on the base layer; inorganic insulating layers on the buffer layer; organic insulating layers on the inorganic insulating layers; and conductive patterns; an element layer on the circuit layer, and including a sensing element and a light-emitting element in an active region; a data line electrically connected to the light-emitting element, and extending from the active region to a wiring region; and a sensing line electrically connected to the sensing element. The wiring region includes: a first region adjacent to the active region; a second region adjacent to the pad region; and an open region between the first region and the second region. The sensing line is located above the data line in the first region and the second region, and the sensing line is located under the data line in the open region.

20 Claims, 11 Drawing Sheets

(56)         References Cited

U.S. PATENT DOCUMENTS

| | | | | |
|---|---|---|---|---|
| 2018/0130856 A1* | 5/2018 | Kim | ................... | H10K 59/353 |
| 2019/0129548 A1* | 5/2019 | Hwang | ............... | G06F 3/0446 |
| 2020/0235172 A1* | 7/2020 | Lee | .................... | G06F 3/0443 |
| 2020/0310580 A1* | 10/2020 | Han | .................... | G06F 3/0414 |
| 2021/0118958 A1* | 4/2021 | Park | .................. | H10D 86/411 |
| 2021/0158751 A1* | 5/2021 | Cha | .................... | G09G 3/3233 |
| 2021/0225970 A1* | 7/2021 | Ryu | .................... | H10K 59/353 |
| 2022/0131111 A1* | 4/2022 | Lee | .................... | H10K 59/40 |
| 2022/0131113 A1* | 4/2022 | Jung | .................. | H10K 77/111 |
| 2022/0158054 A1* | 5/2022 | Cha | .................... | H10H 20/857 |
| 2022/0291779 A1* | 9/2022 | Kim | .................... | G06F 3/0443 |
| 2022/0317852 A1* | 10/2022 | Park | ................. | G06V 40/1306 |
| 2023/0050385 A1* | 2/2023 | Lee | .................... | H10K 59/40 |
| 2023/0075463 A1* | 3/2023 | Lee | .................... | G06V 10/147 |
| 2023/0076553 A1* | 3/2023 | Kim | ................. | G06V 40/1318 |
| 2023/0136067 A1* | 5/2023 | Choi | ................. | H10K 59/131 |
| | | | | 257/72 |

* cited by examiner

DISPLAY DEVICE

CROSS-REFERENCE TO RELATED APPLICATION

The present application claims priority to and the benefit of Korean Patent Application No. 10-2024-0038283, filed on Mar. 20, 2024, in the Korean Intellectual Property Office, the entire disclosure of which is incorporated by reference herein.

BACKGROUND

Aspects of embodiments of the present disclosure relate to a display device including a sensing element.

A display device provides various functions for organically interacting with a user, such as providing information to the user by displaying an image, or sensing the user's input. Recent display devices include a function for sensing information (e.g., biometric information and/or the like), which is provided by a user. A method of sensing user information includes a capacitive method of sensing a change in a capacitance formed between electrodes, an optical method of sensing incident light using a light sensor, an ultrasonic method of sensing a vibration using a piezo-electric material, and the like.

As a structure in which a dead space of a display device is minimized or reduced, an arrangement region for a line for driving a sensing element for a sensing function and the like may be limited.

The above information disclosed in this Background section is for enhancement of understanding of the background of the present disclosure, and therefore, it may contain information that does not constitute prior art.

SUMMARY

One or more embodiments of the present disclosure may be directed to a display device including a display element, a sensing element, and an improved arrangement (e.g., an optimized arrangement) of a sensing line that is connected to the sensing element in a limited region.

One or more embodiments of the present disclosure may be directed to a display device having an expanded sensing region by arranging a sensing line without increasing a dead space, while minimizing or reducing an interference between a sensing line connected to a sensing element and a data line connected to a display element.

According to one or more embodiments of the present disclosure, a display device having an active region, a wiring region on at least one side of the active region, and a pad region adjacent to the wiring region, includes: a base layer; a circuit layer including: a buffer layer on the base layer; a plurality of inorganic insulating layers on the buffer layer; a plurality of organic insulating layers on the inorganic insu-lating layers; and a plurality of conductive patterns; an element layer on the circuit layer, and including a sensing element and a light-emitting element in the active region; a data line electrically connected to the light-emitting element, and extending from the active region to the wiring region; and a sensing line electrically connected to the sensing element, and extending from the active region to the wiring region. The wiring region includes: a first region adjacent to the active region; a second region adjacent to the pad region; and an open region between the first region and the second region, and not including the organic insulating layers. The sensing line is located above the data line in the first region and the second region, and the sensing line is located under the data line in the open region.

In an embodiment, the sensing line may include: a first sensing line part above the inorganic insulating layers in the first region; a second sensing line part under the inorganic insulating layers in the open region; a third sensing line part above the inorganic insulating layers in the second region; and a connection line part connecting between the first sensing line part and the second sensing line part, and connecting between the second sensing line part and the third sensing line part.

In an embodiment, the first sensing line part and the third sensing line part may be located at the same layer as each other between the organic insulating layers, and the second sensing line part may be located under the buffer layer.

In an embodiment, the circuit layer may further include a lower shielding pattern overlapping with the second sensing line part, and located between the second sensing line part and the data line in the open region.

In an embodiment, the lower shielding pattern may be located under the inorganic insulating layers, or between the inorganic insulating layers.

In an embodiment, the circuit layer may further include an upper shielding pattern between the sensing line and the data line in the first region and the second region.

In an embodiment, the upper shielding pattern may be located under the organic insulating layers, or at the same layer as that of an organic insulating layer adjacent to the inorganic insulating layers among the organic insulating layers.

In an embodiment, the connection line part may include a first connection portion penetrating at least one of the organic insulating layers, and a second connection portion penetrating the inorganic insulating layers.

In an embodiment, the data line may be located between the inorganic insulating layers.

In an embodiment, in the active region, the conductive patterns may include: a transistor; a capacitor; a bottom metal layer under the transistor and overlapping with the transistor; and a plurality of connection electrodes electri-cally connected to the light-emitting element or the sensing element, and located between the organic insulating layers. In the wiring region, the conductive patterns may include the data line and the sensing line.

In an embodiment, in the wiring region, the data line may be located at the same layer as that of any one electrode of the transistor or any one electrode of the capacitor.

In an embodiment, in the wiring region, the data line may include: a first layer data line on a first inorganic insulating layer in the first region, the open region, and the second region; and a second layer data line on a second inorganic insulating layer on the first inorganic insulating layer in the first region, the open region, and the second region.

In an embodiment, in the open region, the sensing line may be located at the same layer as that of the bottom metal layer.

In an embodiment, in the first region and the second region, the sensing line may be located at the same layer as that of any one of the connection electrodes.

In an embodiment, the display device may further include at least one dam part on the inorganic insulating layers in the open region, and the at least one dam part may overlap with the sensing line.

In an embodiment, the at least one dam part may extend in a second direction crossing a first direction extending from the active region to the wiring region.

In an embodiment, the display device may further include a sensor layer on the element layer, and including a sensor conductive layer and a sensor insulating layer.

In an embodiment, the wiring region may include a first non-bending region adjacent to the active region, a bending region bent with respect to a virtual axis extending in one direction, and a second non-bending region spaced from the first non-bending region with the bending region therebetween, and the open region may be included in the first non-bending region.

In an embodiment, a width of the second non-bending region in the one direction may be smaller than a width of the first non-bending region in the one direction.

According to one or more embodiments of the present disclosure, a display device having an active region, and a peripheral region adjacent to the active region, includes: a base layer; a circuit layer including: a lower insulating layer on the base layer; an upper insulating layer on the lower insulating layer and comprising an organic material; and a conductive pattern; a display layer on the circuit layer, and including a pixel-defining film having openings therein, and a light-emitting element and a sensing element in the openings, respectively; a data line electrically connected to the light-emitting element, and extending from the active region to the peripheral region; a sensing line electrically connected to the sensing element, and extending from the active region to the peripheral region; and at least one shielding pattern between the data line and the sensing line in the peripheral region. The peripheral region includes: an open region that does not include the upper insulating layer; and a non-open region adjacent to the open region, and that includes the upper insulating layer. The sensing line is located above the data line in the non-open region, and the sensing line is located under the data line in the open region.

In an embodiment, the sensing line may include: an upper sensing line part above the lower insulating layer in the non-open region; and a lower sensing line part under the lower insulating layer in the open region.

In an embodiment, the conductive pattern may include a transistor, a capacitor, a bottom metal layer under the transistor and overlapping with the transistor, and a plurality of connection electrodes electrically connected to the light-emitting element or the sensing element and located in the upper insulating layer. In the peripheral region, the data line may be located at the same layer as that of any one electrode of the transistor or any one electrode of the capacitor.

In an embodiment, in the open region, the sensing line may be located at the same layer as that of the bottom metal layer.

In an embodiment, in the non-open region, the sensing line may be located at the same layer as that of any one of the connection electrodes.

In an embodiment, the at least one shielding pattern may include: a lower shielding pattern under the upper sensing line part in the non-open region; and an upper shielding pattern above the lower sensing line part in the open region.

In an embodiment, the openings may include a first opening and a second opening not overlapping with each other in a plan view. The light-emitting element may include a first light-emitting part electrode on the upper insulating layer, an upper portion of the first light-emitting part electrode being exposed by the first opening, and an emission layer in the first opening. The sensing element may include a first sensing part electrode on the upper insulating layer, an upper portion of the first sensing part electrode being exposed by the second opening, and a photoelectric conversion layer in the second opening.

According to one or more embodiments of the present disclosure, a display device having an active region, and a peripheral region including a bending region bent with respect to a virtual axis extending in one direction, the bending region being spaced from the active region and located on one side of the active region, includes: a base layer; a circuit layer including: a plurality of inorganic insulating layers on the base layer; a plurality of organic insulating layers on the inorganic insulating layers; a transistor; a capacitor; a bottom metal layer under the transistor and overlapping with the transistor; and a plurality of connection electrodes in the organic insulating layers; an element layer on the circuit layer, and including a sensing element and a light-emitting element in the active region; a data line electrically connected to the light-emitting element, and extending from the active region to the bending region; and a sensing line electrically connected to the sensing element, and extending from the active region to the bending region. The peripheral region includes an open region between the bending region and the active region, the organic insulating layers not being located in the open region. In the open region, the sensing line is at the same layer as that of the bottom metal layer under the data line, and between the active region and the open region, the sensing line is at the same layer as that of one connection electrode among the connection electrodes above the data line.

However, the present disclosure is not limited to the above aspects and features, and the above and additional aspects and features will be set forth, in part, in the detailed description that follows with reference to the drawings, and in part, may be apparent therefrom, or may be learned by practicing one or more of the presented embodiments of the present disclosure.

BRIEF DESCRIPTION OF THE DRAWINGS

The above and other aspects and features of the present disclosure will be more clearly understood from the following detailed description of the illustrative, non-limiting embodiments with reference to the accompanying drawings, in which.

DETAILED DESCRIPTION

Figure 1:
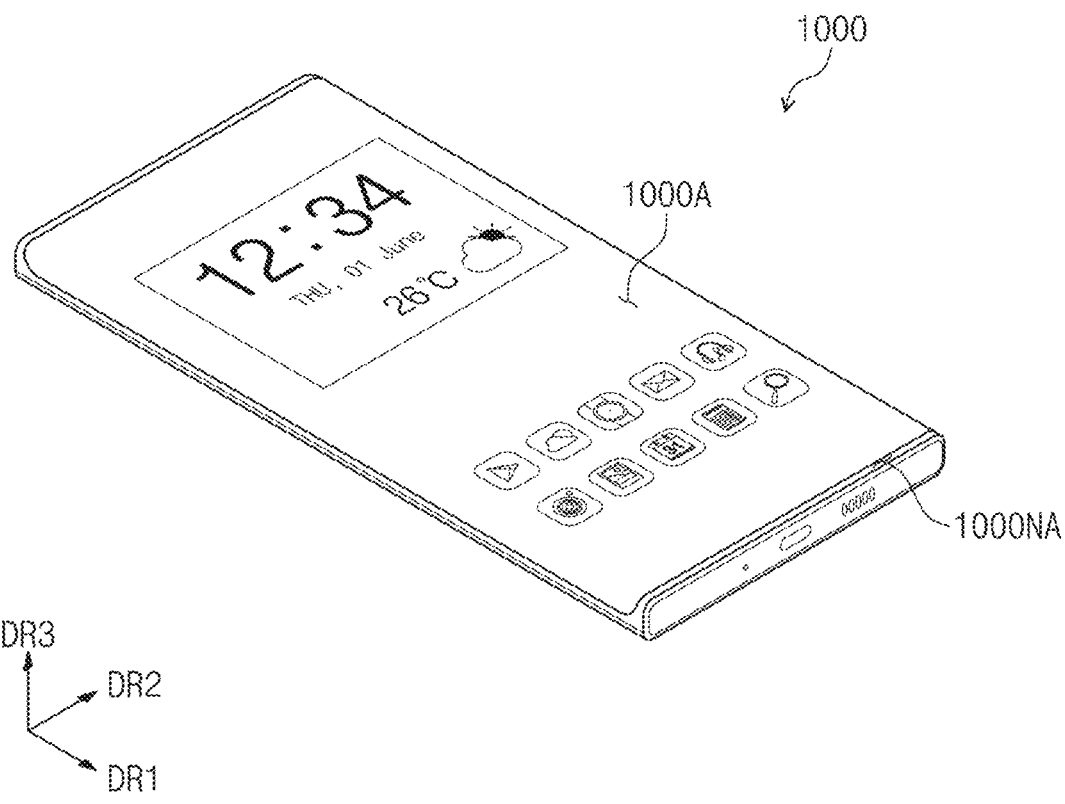
FIG. 1 is a perspective view of a display device according to an embodiment of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

Further, as would be understood by a person having ordinary skill in the art, in view of the present disclosure in its entirety, each suitable feature of the various embodiments of the present disclosure may be combined or combined with each other, partially or entirely, and may be technically interlocked and operated in various suitable ways, and each embodiment may be implemented independently of each other or in conjunction with each other in any suitable manner, unless otherwise stated or implied.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

Further, it should be expected that the shapes shown in the figures may vary in practice depending, for example, on tolerances and/or manufacturing techniques. Accordingly, the embodiments of the present disclosure should not be construed as being limited to the specific shapes shown in the figures, and should be construed considering changes in shapes that may occur, for example, as a result of manufacturing. As such, the shapes shown in the drawings may not depict the actual shapes of areas of the device, and the present disclosure is not limited thereto.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. For example, the phrase "directly disposed" may mean that there is no layer, film, region, plate, and the like between a portion of a layer, film, region, plate, and the like and another portion. For example, the phrase "directly disposed" may mean that two layers or two members are disposed without using an additional member such as an adhesive member therebetween. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view of a display device 1000 according to an embodiment of the present disclosure.

The display device 1000 according to an embodiment may be activated in response to an electrical signal. For example, the display device 1000 may be a small-sized device or a medium-sized device, such as a smartphone, a personal computer, a laptop, a personal digital assistant, a car navigation unit, a game console, a tablet PC, or a camera. As another example, the display device 1000 may be a large-sized device, such as a television, a monitor, or an outdoor billboard. However, the present disclosure is not limited thereto, and the display device 1000 may be employed in any suitable electronic devices that display images. FIG. 1 illustrates that the display device 1000 is a smartphone as a representative example.

An active region 1000A and a peripheral region 1000NA may be defined in the display device 1000. The display device 1000 may display an image through the active region 1000A. The active region 1000A may include a plane defined by a first direction DR1 and a second direction DR2. The peripheral region 1000NA may surround (e.g., around a periphery of) the active region 1000A.

A thickness direction of the display device 1000 may be parallel to or substantially parallel to a third direction DR3 crossing the first direction DR1 and the second direction DR2. Thus, front surfaces (e.g., upper surfaces) and rear surfaces (e.g., lower surfaces) of the members constituting the display device 1000 may be defined on the basis of the third direction DR3.

Figure 2:
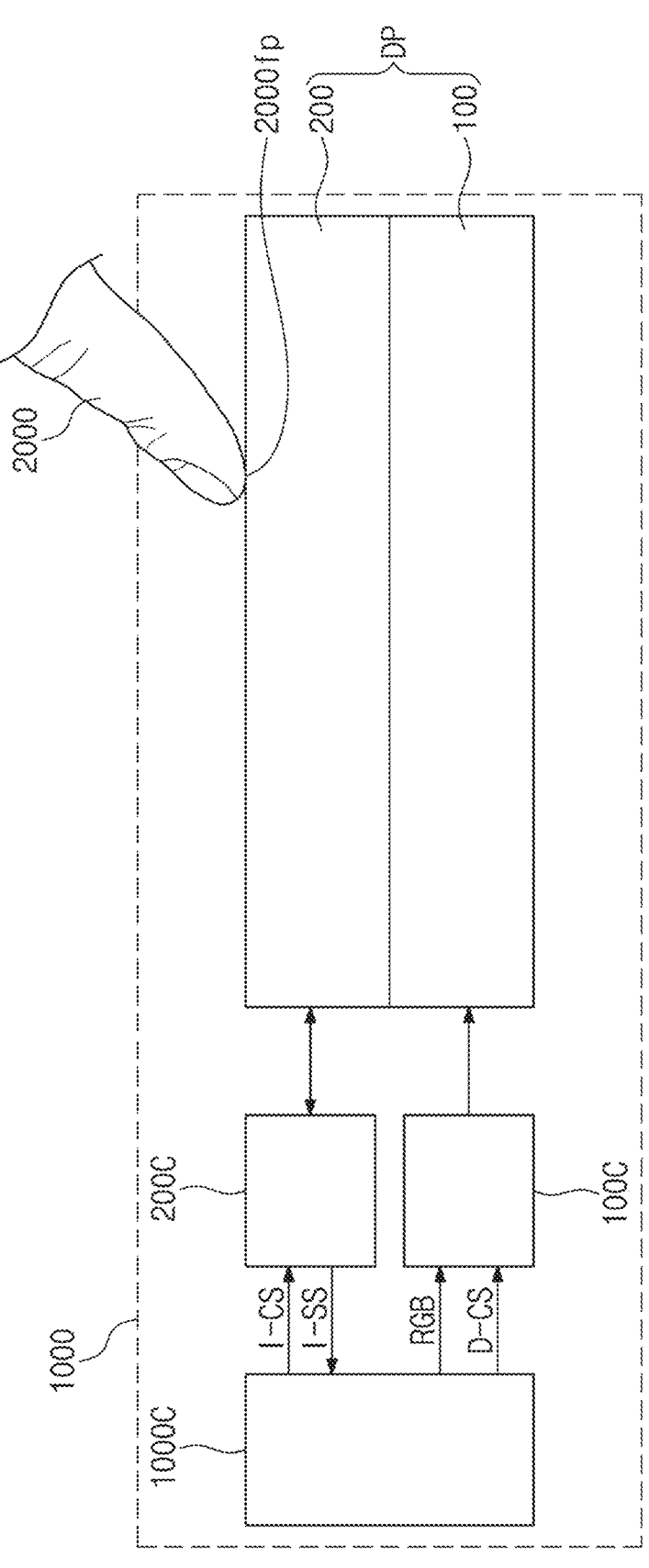
FIG. 2 is a block diagram of a display device according to an embodiment of the present disclosure.

FIG. 2 is a block diagram of the display device 1000 according to an embodiment of the present disclosure.

Referring to FIG. 2, the display device 1000 may include a display panel DP, a display driver 100C, a sensor driver 200C, and a main driver 1000C. The display panel DP may include a display layer 100, and a sensor layer 200 disposed on the display layer 100. In an embodiment of the present disclosure, the sensor layer 200 may be omitted as needed or desired.

The display layer 100 may be a component that substantially generates an image. The display layer 100 may be an emissive display layer. For example, the display layer 100 may be an organic light-emitting display layer, an inorganic light-emitting display layer, an organic-inorganic light-emitting display layer, a quantum dot display layer, a micro-LED display layer, or a nano-LED display layer. In addition, the display layer 100 may include a sensor that senses light reflected by a user's fingerprint 2000fp, or that reacts to light.

The sensor layer 200 may be disposed on the display layer 100. The sensor layer 200 may sense an external input 2000 applied from the outside. The external input 2000 may include any suitable input or input means capable of providing a change in a capacitance. For example, the sensor layer 200 may sense an input from an active-kind of input means that provides a driving signal, as well as an input from a passive-kind of input means such as a part of a user's body.

The main driver 1000C may control the overall operations of the display device 1000. For example, the main driver 1000C may control an operation of the display driver 100C and the sensor driver 200C. The main driver 1000C may include at least one microprocessor, and may further include a graphics controller. The main driver 1000C may be referred to as an application processor, a central processing unit, or a main processor.

The display driver 100C may drive the display layer 100. The display driver 100C may receive image data RGB and a control signal D-CS from the main driver 1000C. The control signal D-CS may include various suitable signals. For example, the control signal D-CS may include an input vertical synchronization signal, an input horizontal synchronization signal, a main clock, a data enable signal, and the like. The display driver 100C may generate a vertical synchronization signal and a horizontal synchronization signal for controlling the timing of providing a signal to the display layer 100 on the basis of the control signal D-CS.

The sensor driver 200C may drive the sensor layer 200. The sensor driver 200C may receive a control signal I-CS from the main driver 1000C. The control signal I-CS may include a clock signal and a mode determination signal for determining a driving mode of the sensor driver 200C.

The sensor driver 200C may calculate coordinate information of an input on the basis of a signal received from the sensor layer 200, and may provide a coordinate signal I-SS having the coordinate information to the main driver 1000C. The main driver 1000C executes an operation corresponding to a user's input on the basis of the coordinate signal I-SS. For example, the main driver 1000C may operate the display driver 100C, so that a new application image is displayed in the display layer 100.

Figure 3:
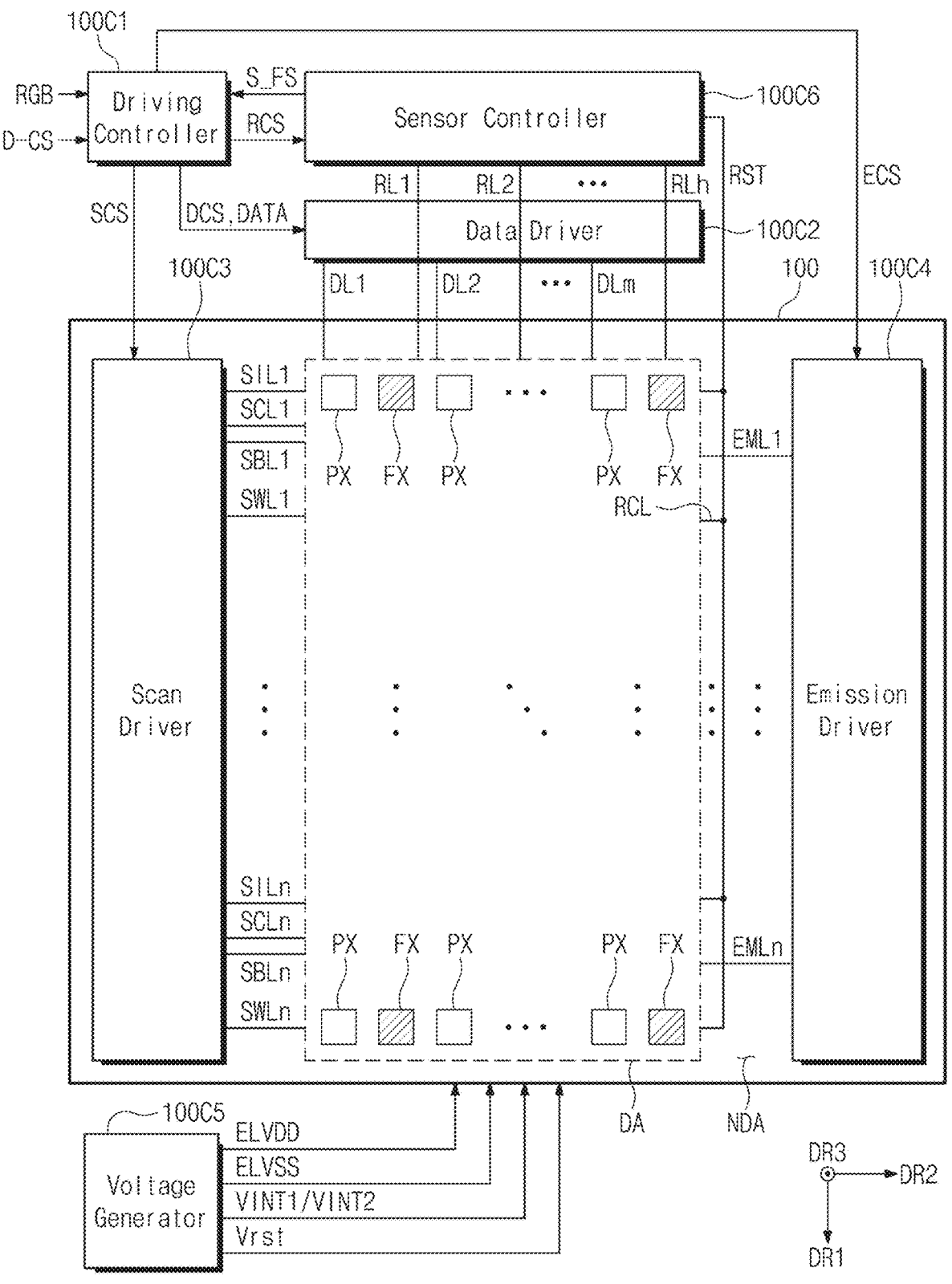
FIG. 3 is a block diagram of a display driver and a display layer according to an embodiment of the present disclosure.

FIG. 3 is a block diagram of a display driver and a display layer according to an embodiment of the present disclosure.

Referring to FIGS. 2 and 3, the display driver 100C may include a driving controller 100C1, a data driver 100C2, a scan driver 100C3, an emission driver 100C4, a voltage generator 100C5, and a sensor controller 100C6.

The display layer 100 may include an active region DA (e.g., a display region) corresponding to the active region 1000A (e.g., see FIG. 1) of the display device, and a peripheral region NDA (e.g., a non-display region) corresponding to the peripheral region 1000NA of the display device.

The display layer 100 may include a plurality of pixels PX disposed in the active region DA, and a plurality of sensors FX disposed in the active region DA. The display layer 100 further includes initialization scan lines SIL1 to SILn, compensation scan lines SCL1 to SCLn, write scan lines SWL1 to SWLn, black scan lines SBL1 to SBLn, emission control lines EML1 to EMLn, data lines DL1 to DLm, and sensing lines (e.g., also referred to as readout lines) RL1 to RLh, where n, m, and h are integers greater than one.

The initialization scan lines SIL1 to SILn, the compensation scan lines SCL1 to SCLn, the write scan lines SWL1 to SWLn, the black scan lines SBL1 to SBLn, and the emission control lines EML1 to EMLn may extend in the second direction DR2. The initialization scan lines SIL1 to SILn, the compensation scan lines SCL1 to SCLn, the write scan lines SWL1 to SWLn, the black scan lines SBL1 to SBLn, and the emission control lines EML1 to EMLn may be arranged to be spaced apart from each other along the first direction DR1. The data lines DL1 to DLm and the sensing lines RL1 to RLh may extend in the first direction DR1, and may be arranged to be spaced apart from each other along the second direction DR2.

The plurality of pixels PX are electrically connected to the initialization scan lines SIL1 to SILn, the compensation scan lines SCL1 to SCLn, the write scan lines SWL1 to SWLn, the black scan lines SBL1 to SBLn, the emission control lines EML1 to EMLn, and the data lines DL1 to DLm. For example, the plurality of pixels PX may each be electrically connected to four scan lines. However, the number of scan lines connected to each pixel PX is not limited thereto, and may be variously modified as needed or desired.

The plurality of sensors FX are electrically connected to the sensing lines RL1 to RLh. One sensor FX may be electrically connected to one scan line (e.g., one write scan line among the write scan lines SWL1 to SWLn). However, the present disclosure is not limited thereto. The number of scan lines connected to each sensor FX may be variously modified as needed or desired.

As an example, the number of the sensing lines RL1 to RLh may correspond to ½ of the number of the data lines DL1 to DLm. However, the present disclosure is not limited thereto. For example, in an embodiment, the number of the sensing lines RL1 to RLh may correspond to ¼, ⅛, or the like of the number of the data lines DL1 to DLm, or the number of the sensing lines RL1 to RLh may be the same as the number of the data lines DL1 to DLm.

The driving controller 100C1 receives the image data RGB and the control signal D-CS. The driving controller 100C1 generates an image data signal DATA by converting a data format of the image data RGB to comply with the specifications of an interface with the data driver 100C2. The driving controller 100C1 outputs a first control signal SCS, a second control signal ECS, a third control signal DCS, and a fourth control signal RCS.

The data driver 100C2 receives the third control signal DCS and the image data signal DATA from the driving controller 100C1. The data driver 100C2 converts the image data signal DATA into data signals, and outputs the data signals to the plurality of data lines DL1 to DLm described in more detail below. The data signals may be analog voltages corresponding to grayscale values of the image data signal DATA.

The scan driver 100C3 receives the first control signal SCS from the driving controller 100C1. The scan driver 100C3 may output scan signals to scan lines in response to the first control signal SCS. For example, the scan driver 100C3 outputs initialization scan signals to the initialization scan lines SIL1 to SILn in response to the first control signal SCS, and outputs compensation scan signals to the compensation scan lines SCL1 to SCLn in response to the first control signal SCS. In addition, the scan driver 100C3 may output write scan signals to the write scan lines SWL1 to SWLn in response to the first control signal SCS, and may output black scan signals to the black scan lines SBL1 to SBLn in response to the first control signal SCS.

The emission driver 100C4 receives the second control signal ECS from the driving controller 100C1. The emission driver 100C4 may output emission control signals to the emission control lines EML1 to EMLn in response to the second control signal ECS. As another example, the scan driver 100C3 may be connected to the emission control lines EML1 to EMLn. In this case, the emission driver 100C4 may be omitted, and the scan driver 100C3 may output the emission control signals to the emission control lines EML1 to EMLn.

The scan driver 100C3 and the emission driver 100C4 may be disposed in the peripheral region NDA of the display layer 100. However, the present disclosure is not limited thereto. For example, at least a portion of each of the scan driver 100C3 and the emission driver 100C4 may be disposed in the active region DA.

The voltage generator 100C5 generates voltages used for an operation of the display layer 100. In an embodiment, the voltage generator 100C5 may generate a first driving voltage ELVDD, a second driving voltage ELVSS, a first initialization voltage VINT1, a second initialization voltage VINT2, and a reset voltage Vrst.

The sensor controller 100C6 receives the fourth control signal RCS from the driving controller 100C1.

The sensor controller 100C6 may receive sensing signals from the sensing lines RL1 to RLh in response to the fourth control signal RCS. The sensor controller 100C6 may process the sensing signals received from the sensing lines RL1 to RLh, and may provide processed sensing signals S_FS to the driving controller 100C1.

Figure 4:
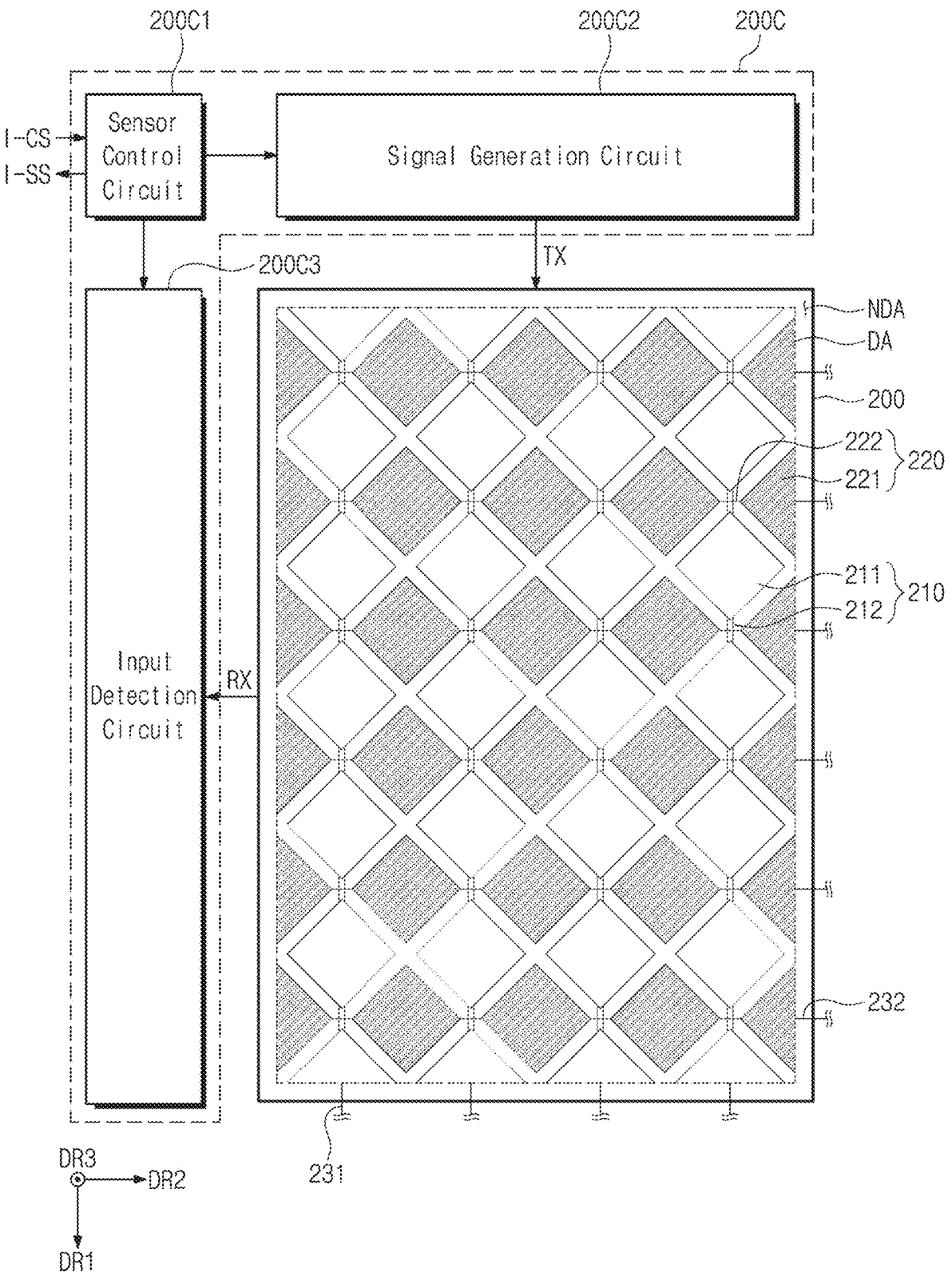
FIG. 4 is a block diagram of a sensor driver and a sensor layer according to an embodiment of the present disclosure.

FIG. 4 is a block diagram of a sensor driver and a sensor layer according to an embodiment of the present disclosure.

Referring to FIG. 4, the sensor layer 200 may include a plurality of first sensing electrodes 210 and a plurality of second sensing electrodes 220 disposed in the active region DA. The plurality of second sensing electrodes 220 may each cross the plurality of first sensing electrodes 210.

The plurality of first sensing electrodes 210 may each extend in the first direction DR1, and the plurality of first sensing electrodes 210 may be arranged to be spaced apart from each other along the second direction DR2. The plurality of second sensing electrodes 220 may each extend in the second direction DR2, and the plurality of second sensing electrodes 220 may be arranged to be spaced apart from each other along the first direction DR1.

The plurality of first sensing electrodes 210 may each include a sensing pattern 211 and a connection pattern 212. Two sensing patterns 211 adjacent to each other may be electrically connected to each other by two connection patterns 212, but the present disclosure is not particularly limited thereto. The sensing pattern 211 and the connection pattern 212 may be disposed at (e.g., in or on) different layers from each other.

The plurality of second sensing electrodes 220 may each include a first portion 221 and a second portion 222. The first portion 221 and the second portion 222 may have an integrated shape, and may be disposed at (e.g., in or on) the same layer as each other. For example, the first portion 221 and the second portion 222 may be disposed at (e.g., in or on) the same layer as that of the sensing pattern 211. Two connection patterns 212 may be insulated from and may cross the second portion 222.

The sensor layer 200 may further include a plurality of first trace lines 231 electrically connected to the first sensing electrodes 210, and a plurality of second trace lines 232 electrically connected to the second sensing electrodes 220. The first trace lines 231 and the second trace lines 232 may each be disposed in the peripheral region NDA, but the present disclosure is not particularly limited thereto. For example, at least a portion of the first and second trace lines 231 and 232 may be disposed to overlap with the active region DA.

The sensor driver 200C may receive the control signal I-CS from the main driver 1000C (e.g., see FIG. 2). The sensor driver 200C may provide the coordinate signal I-SS to the main driver 1000C (e.g., see FIG. 2).

The sensor driver 200C may be embodied as an integrated circuit (IC), and may be directly mounted in a suitable region (e.g., a predetermined region) of the sensor layer 200, or may be mounted on a separate printed circuit board using a chip-on-film (COF) method and electrically connected to the sensor layer 200.

The sensor driver 200C may include a sensor control circuit 200C1, a signal generation circuit 200C2, and an input detection circuit 200C3. The sensor control circuit 200C1 may control an operation of the signal generation circuit 200C2 and the input detection circuit 200C3 on the basis of the control signal I-CS.

The signal generation circuit 200C2 may output transmission signals TX to the first sensing electrodes 210 of the sensor layer 200. The input detection circuit 200C3 may receive input signals RX from the sensor layer 200. For example, the input detection circuit 200C3 may receive the input signals RX from the second sensing electrodes 220. In another embodiment of the present disclosure, the signal generation circuit 200C2 may output the transmission signals TX to the second sensing electrodes 220 of the sensor layer 200, and the input detection circuit 200C3 may receive the input signals RX from the first sensing electrodes 210.

The input detection circuit 200C3 may convert an analog signal into a digital signal. For example, the input detection circuit 200C3 amplifies and then filters a received analog signal. In other words, the input detection circuit 200C3 may convert a filtered signal into a digital signal.

Figure 5:
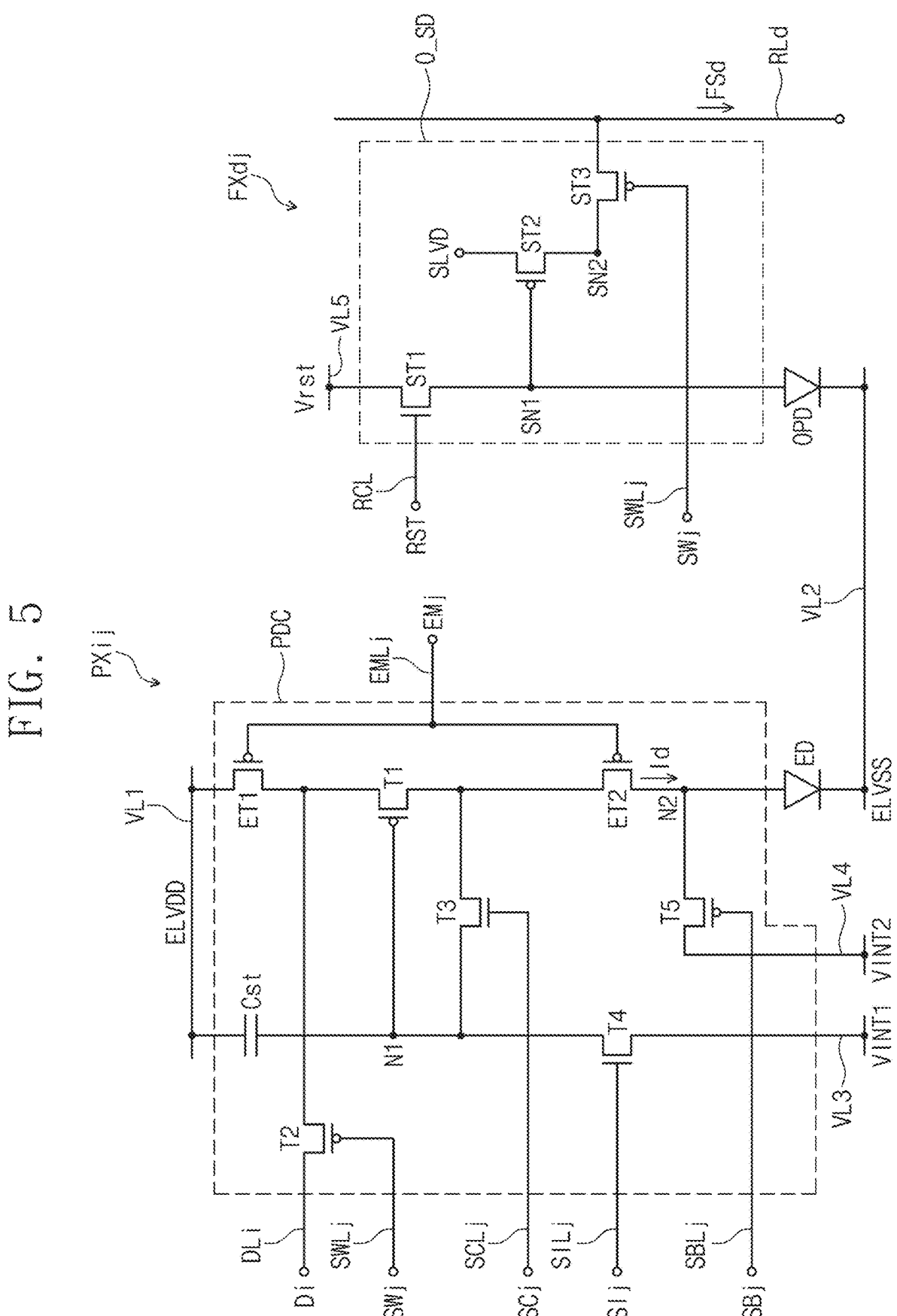
FIG. 5 is an equivalent circuit diagram of a pixel and a sensor according to an embodiment of the present disclosure.

FIG. 5 is an equivalent circuit diagram of a pixel and a sensor according to an embodiment of the present disclosure.

FIG. 5 illustrates an equivalent circuit diagram of one pixel PXij from among the plurality of pixels PX (e.g., see FIG. 3) as a representative example. The plurality of pixels PX may have the same or substantially the same circuit structure as each other, and thus, the circuit structure of the pixel PXij will be described in more detail hereinafter with reference to FIG. 5, and redundant description of the other remaining pixels PX may not be repeated. In addition, FIG. 5 illustrates an equivalent circuit diagram of one sensor FXdj among the plurality of sensors FX illustrated in FIG. 3 as a representative example. The plurality of sensors FX may have the same or substantially the same circuit structure as each other, and thus, the circuit structure of the sensor FXdj will be described in more detail hereinafter with reference to FIG. 5, and redundant description of the other remaining sensors FX may not be repeated.

Referring to FIGS. 3 and 5, the pixel PXij is connected to an i-th data line DLi among the data lines DL1 to DLm, a j-th initialization scan line SILj among the initialization scan lines SIL1 to SILn, a j-th compensation scan line SCLj among the compensation scan lines SCL1 to SCLn, a j-th write scan line SWLj among the write scan lines SWL1 to SWLn, a j-th black scan line SBLj among the black scan lines SBL1 to SBLn, and a j-th emission control line EMLj among the emission control lines EML1 to EMLn.

The pixel PXij includes a light-emitting element ED and a pixel driving circuit PDC. The light-emitting element ED may be a light-emitting diode. As an example, the light-emitting element ED may be an organic light-emitting diode including an organic emission layer, but the present disclosure is not particularly limited thereto.

The pixel driving circuit PDC includes first to fifth transistors T1, T2, T3, T4, and T5, first and second emission control transistors ET1 and ET2, and one capacitor Cst.

At least one among the first to fifth transistors T1, T2, T3, T4, and T5 and/or the first and second emission control transistors ET1 and ET2 may be a transistor having a low-temperature polycrystalline silicon (LTPS) semiconductor layer. At least one among the first to fifth transistors T1, T2, T3, T4, and T5 and/or the first and second emission control transistors ET1 and ET2 may be a transistor having an oxide semiconductor layer. For example, the third and fourth transistors T3 and T4 may be oxide semiconductor transistors, and the first, second, and fifth transistors T1, T2, and T5 and the first and second emission control transistors ET1 and ET2 may be LTPS transistors.

In more detail, the first transistor T1 that directly affects a brightness of the display device 1000 (e.g., see FIG. 1) may include a semiconductor layer including polycrystalline silicon having a high reliability, and thus, a display device having a high resolution may be realized. Because an oxide semiconductor has high carrier mobility and low leakage current, a voltage drop may not be significant even if a driving time is long. In other words, a color change of an image according to a voltage drop may not be significant even during low frequency driving, and thus, low frequency driving may be possible. As described above, because an oxide semiconductor has low leakage current, at least one of the fourth transistor T4 or the third transistor T3 connected to a third electrode (e.g., a gate electrode) of the first transistor T1 may be employed as an oxide semiconductor, thereby preventing or substantially preventing a leakage current that may flow to the gate electrode, and reducing a power consumption at the same time.

A portion of the first to fifth transistors T1, T2, T3, T4, and T5, and the first and second emission control transistors ET1 and ET2 may be a P-type transistor, and a remaining portion may be an N-type transistor. For example, the first, second, and fifth transistors T1, T2, and T5, and the first and second emission control transistors ET1 and ET2 may be P-type transistors, and the third and fourth transistors T3 and T4 may be N-type transistors.

A configuration of the pixel driving circuit PDC according to the present disclosure is not limited to the embodiment illustrated in FIG. 5. The pixel driving circuit PDC illustrated in FIG. 5 may be variously modified as needed or desired, and the configuration of the pixel driving circuit PDC may be variously modified as needed or desired. For example, the first to fifth transistors T1, T2, T3, T4, and T5 and the first and second emission control transistors ET1 and ET2 may all be P-type transistors or N-type transistors.

The j-th initialization scan line SILj, the j-th compensation scan line SCLj, the j-th write scan line SWLj, the j-th black scan line SBLj, and the j-th emission control line EMLj may transfer a j-th initialization scan signal SIj, a j-th compensation scan signal SCj, a j-th write scan signal SWj, a j-th black scan signal SBj, and a j-th emission control signal EMj, respectively, to the pixel PXij. The i-th data line DLi transfers an i-th data signal Di to the pixel PXij. The i-th data signal Di may have a voltage level corresponding to the image data RGB (e.g., see FIG. 2) input to the display device 1000.

First and second driving voltage lines VL1 and VL2 may transfer a first driving voltage ELVDD and a second driving voltage ELVSS, respectively, to the pixel PXij. In addition, first and second initialization voltage lines VL3 and VL4 may transfer a first initialization voltage VINT1 and a second initialization voltage VINT2, respectively, to the pixel PXij.

The first transistor T1 is connected between the first driving voltage line VL1 that receives the first driving voltage ELVDD and the light-emitting element ED. The first transistor T1 includes a first electrode connected to the first driving voltage line VL1 via the first emission control transistor ET1, a second electrode connected to the light-emitting element ED via the second emission control transistor ET2, and a third electrode (e.g., a gate electrode) connected to one end (e.g., a first node N1) of the capacitor Cst. The first transistor T1 may receive the i-th data signal Di transferred by the i-th data line DLi according to a switching operation of the second transistor T2, and may supply a driving current Id to the light-emitting element ED.

The second transistor T2 is connected between the data line DLi and the first electrode of the first transistor T1. The second transistor T2 includes a first electrode connected to the data line DLi, a second electrode connected to the first electrode of the first transistor T1, and a third electrode (e.g., a gate electrode) connected to the j-th write scan line SWLj. The second transistor T2 may be turned on in response to the write scan signal SWj received through the j-th write scan line SWLj, and may transfer the i-th data signal Di transferred from the i-th data line DLi to the first electrode of the first transistor T1.

The third transistor T3 is connected between the second electrode of the first transistor T1 and the first node N1. The third transistor T3 includes a first electrode connected to the third electrode of the first transistor T1, a second electrode connected to the second electrode of the first transistor T1, and a third electrode (e.g., a gate electrode) connected to the j-th compensation scan line SCLj. The third transistor T3 may be turned on in response to the j-th compensation scan signal SCj received through the j-th compensation scan line SCLj to connect the third electrode and the second electrode of the first transistor T1 to each other, so that the first transistor T1 may be diode-connected.

The fourth transistor T4 is connected between the first initialization voltage line VL3 to which the first initialization voltage VINT1 is applied and the first node N1. The fourth transistor T4 includes a first electrode connected to the first initialization voltage line VL3 through which the first initialization voltage VINT1 is transferred, a second electrode connected to the first node N1, and a third electrode (e.g., a gate electrode) connected to the j-th initialization scan line SILj. The fourth transistor T4 is turned on in response to the j-th initialization scan signal SIj received through the j-th initialization scan line SILj. The turned-on fourth transistor T4 transfers the first initialization voltage VINT1 to the first node N1, and initializes a potential of the third electrode of the first transistor T1 (e.g., a potential of the first node N1).

The first emission control transistor ET1 includes a first electrode connected to the first driving voltage line VL1, a second electrode connected to the first electrode of the first transistor T1, and a third electrode (e.g., a gate electrode) connected to the j-th emission control line EMLj.

The second emission control transistor ET2 includes a first electrode connected to the second electrode of the first transistor T1, a second electrode connected to the light-emitting element ED, and a third electrode (e.g., a gate electrode) connected to the j-th emission control line EMLj.

The first and second emission control transistors ET1 and ET2 are concurrently or substantially simultaneously turned on with each other in response to the j-th emission control signal EMj received through the j-th emission control line EMLj. The first driving voltage ELVDD applied through the turned-on first emission control transistor ET1 may be compensated through the diode-connected first transistor T1, and may then be transferred to the light-emitting element ED.

The fifth transistor T5 includes a first electrode connected to the second initialization voltage line VL4 through which the second initialization voltage VINT2 is transferred, a second electrode connected to the second electrode of the second emission control transistor ET2, and a third electrode (e.g., a gate electrode) connected to the black scan line SBLj. The second initialization voltage VINT2 may have a voltage level lower than or equal to that of the first initialization voltage VINT1.

One end of the capacitor Cst is connected to the third electrode of the first transistor T1 as described above, and another end of the capacitor Cst is connected to the first driving voltage line VL1. A cathode of the light-emitting element ED may be connected to the second driving voltage line VL2 that transfers the second driving voltage ELVSS. The second driving voltage ELVSS may have a lower voltage level than that of the first driving voltage ELVDD.

The sensor FX is connected to a d-th sensing line RLd among the sensing lines RL1 to RLh, the j-th write scan line SWLj (e.g., referred to as an output control line), and a reset control line RCL. The sensor FX includes a sensing element OPD (e.g., referred to as a light-sensing element) and a sensor driving circuit O_SD.

The sensing element OPD may be a photodiode. As an example, the sensing element OPD may be an organic photodiode including an organic material as a photoelectric conversion layer. A first electrode AE-S (e.g., see FIG. 6) of the sensing element OPD may be connected to a first sensing node SN1, and a second electrode CE of the sensing element OPD may be connected to the second driving voltage line VL2 that transfers the second driving voltage ELVSS. FIG. 5 illustrates that the sensor FX includes one sensing element OPD as an example, but the present disclosure is not particularly limited thereto. For example, the sensor FX may include z sensing elements that are connected in parallel with each other. Here, z may be an integer equal to or greater than 2.

The sensor driving circuit O_SD includes three transistors ST1, ST2, and ST3. The three transistors ST1, ST2, and ST3 may include a reset transistor ST1, an amplifying transistor ST2, and an output transistor ST3. At least one of the reset transistor ST1, the amplifying transistor ST2, or the output transistor ST3 may be an oxide semiconductor transistor. As an example, the reset transistor ST1 may be an oxide semiconductor transistor, and the amplifying transistor ST2 and the output transistor ST3 may be LTPS transistors. However, the present disclosure is not limited thereto, and the reset transistor ST1 and the output transistor ST3 may be oxide semiconductor transistors, and the amplifying transistor ST2 may be a LTPS transistor.

In addition, a portion of the reset transistor ST1, the amplifying transistor ST2, and the output transistor ST3 may be a P-type transistor, and a portion of the reset transistor ST1, the amplifying transistor ST2, and the output transistor ST3 may be an N-type transistor. As an example of the present disclosure, the amplifying transistor ST2 and the output transistor ST3 may be P-type transistors, and the reset transistor ST1 may be an N-type transistor. However, the present disclosure is not limited thereto, and the reset transistor ST1, the amplifying transistor ST2, and the output transistor ST3 may all be N-type transistors or P-type transistors.

A circuit configuration of the sensor driving circuit O_SD is not limited to that illustrated in FIG. 5. The sensor driving circuit O_SD may be variously modified as needed or desired, and the configuration of the sensor driving circuit O_SD may be variously modified as needed or desired.

The reset transistor ST1 includes a first electrode connected to a third initialization voltage line VL5 and receives a reset voltage Vrst, a second electrode connected to the first sensing node SN1, and a third electrode that receives a reset control signal RST. The reset transistor ST1 may reset a potential of the first sensing node SN1 to the reset voltage Vrst in response to the reset control signal RST. The reset control signal RST may be a signal that is provided through the reset control line RCL.

The amplifying transistor ST2 includes a first electrode that receives a sensing driving voltage SLVD, a second electrode that is connected to a second sensing node SN2, and a third electrode that is connected to the first sensing node SN1. The amplifying transistor ST2 may be turned on according to a potential of the first sensing node SN1, and may apply the sensing driving voltage SLVD to the second sensing node SN2. As an example, the sensing driving voltage SLVD may be one among the first driving voltage ELVDD, the first initialization voltage VINT1, or the second initialization voltage VINT2. If (e.g., when) the sensing driving voltage SLVD is the first driving voltage ELVDD, the first electrode of the amplifying transistor ST2 may be electrically connected to the first driving voltage line VL1. If (e.g., when) the sensing driving voltage SLVD is the first initialization voltage VINT1, the first electrode of the amplifying transistor ST2 may be electrically connected to the first initialization voltage line VL3. If (e.g., when) the sensing driving voltage SLVD is the second initialization voltage VINT2, the first electrode of the amplifying transistor ST2 may be electrically connected to the second initialization voltage line VL4.

The output transistor ST3 includes a first electrode that is connected to the second sensing node SN2, a second electrode that is connected to the d-th sensing line RLd, and a third electrode that receives an output control signal. The output transistor ST3 may transfer a sensing signal FSd to the d-th sensing line RLd in response to the output control signal. The output control signal may be a j-th write scan signal SWj (e.g., referred to as a j-th output control signal) supplied through the j-th write scan line SWLj. In other words, the output transistor ST3 may receive the j-th write scan signal SWj supplied from the j-th write scan line SWLj as the output control signal.

A reset period may be defined as an activation period (e.g., a high-level period) of the reset control line RCL. When a high-level reset control signal RST is supplied through the reset control line RCL, the reset transistor ST1 is turned on. As another example, if (e.g., when) the reset transistor ST1 is formed of a PMOS transistor, a low-level reset control signal RST may be supplied to the reset control line RCL during the reset period. During the reset period, the first sensing node SN1 may be reset to a potential corresponding to the reset voltage Vrst. As an example, the reset voltage Vrst may have a lower voltage level than that of the second driving voltage ELVSS.

The sensing element OPD of the sensor FX may be exposed to light during an emission period of the light-emitting element ED. A voltage of the first sensing node SN1 may maintain or substantially maintain the reset voltage Vrst in the reset period, and then may be gradually shifted to the second driving voltage ELVSS as the sensing element OPD is exposed to light. The amplifying transistor ST2 may be a source follower amplifier that generates source-drain current in proportion to the amount of charge of the first sensing node SN1 input to the third electrode.

A low-level j-th write scan signal SWj is supplied to the output transistor ST3 through the j-th write scan line SWLj in an output period. When the output transistor ST3 is turned on in response to the low-level j-th write scan signal SWj, the sensing signal FSd corresponding to a current flowing through the amplifying transistor ST2 may be output to the d-th sensing line RLd.

Figure 6:
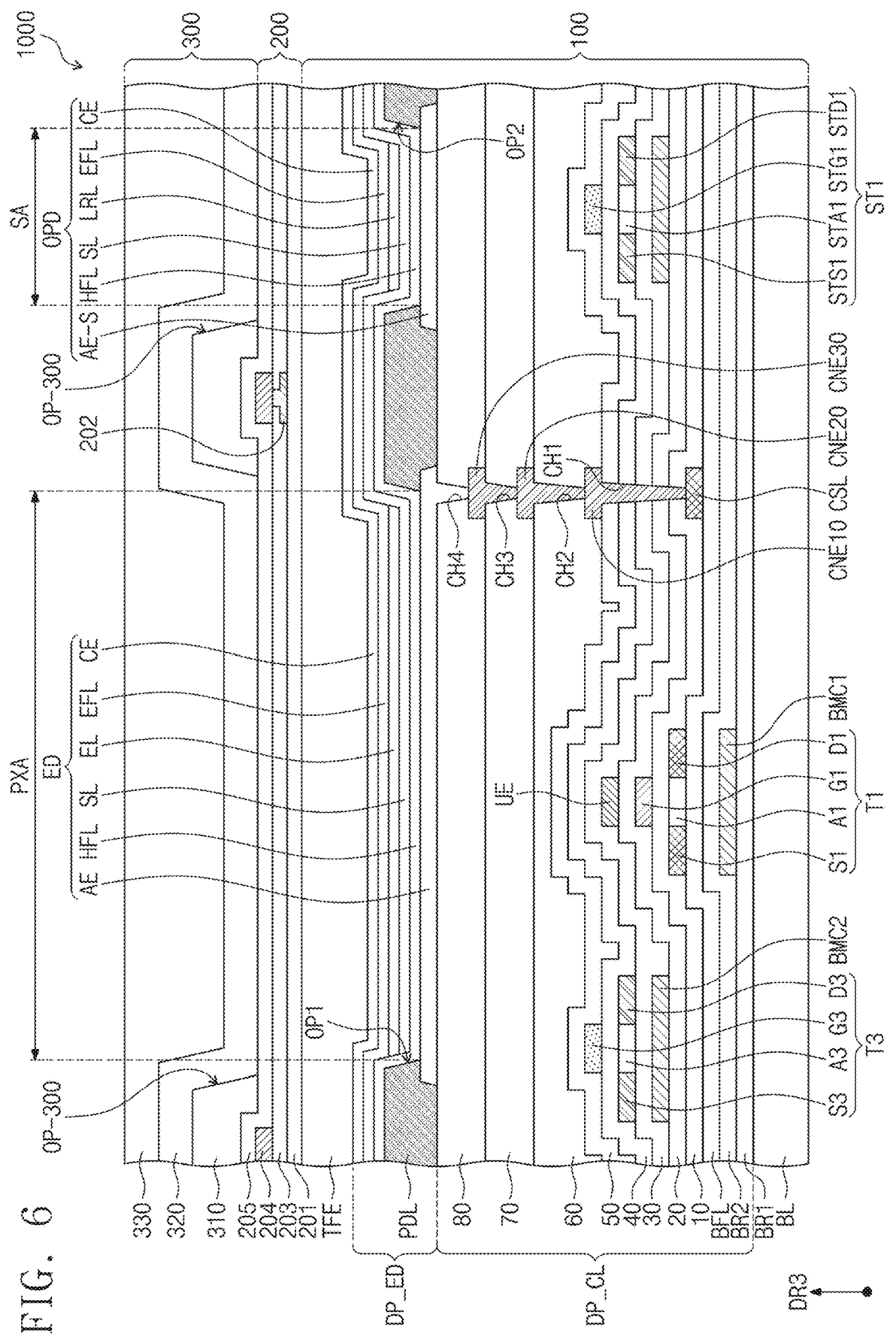
FIG. 6 is a cross-sectional view of a display device according to an embodiment of the present disclosure.

FIG. 6 is a cross-sectional view of a display device according to an embodiment of the present disclosure.

Referring to FIG. 6, the display layer 100 may include a base layer BL. The display layer 100 may further include a circuit layer DP_CL, an element layer DP_ED, and an encapsulation layer TFE, which are sequentially disposed on the base layer BL.

The circuit layer DP_CL may include a plurality of insulating layers and a plurality of conductive patterns. In addition, the circuit layer DP_CL may include at least one inorganic layer disposed below the plurality of insulating layers. The at least one inorganic layer may include at least one of a buffer layer or a barrier layer.

The circuit layer DP_CL may include at least one inorganic layer disposed on an upper surface of the base layer BL. The inorganic layer may include at least one of aluminum oxide, titanium oxide, silicon oxide, silicon oxynitride, zirconium oxide, or hafnium oxide. The inorganic layer may be formed of multiple layers. Multi-layered inorganic layers may constitute barrier layers BR1 and BR2 and/or a buffer layer BFL to be described in more detail below. The barrier layers BR1 and BR2 and the buffer layer BFL may be selectively disposed as needed or desired.

The barrier layers BR1 and BR2 prevent or substantially prevent foreign substances from being introduced from the outside. The barrier layers BR1 and BR2 may include at least one of a silicon oxide layer or a silicon nitride layer. The silicon oxide layer and the silicon nitride layer may each be provided in a plurality, and the silicon oxide layers and the silicon nitride layers may be alternately stacked.

The barrier layers BR1 and BR2 may include a first barrier layer BR1 and a second barrier layer BR2. A first bottom metal layer BMC1 may be disposed between the first barrier layer BR1 and the second barrier layer BR2.

FIG. 6 and the like illustrate that the first bottom metal layer BMC1 is disposed between the first barrier layer BR1 and the second barrier layer BR2, but the present disclosure is not limited thereto, and at least one of the first barrier layer BR1 or the second barrier layer BR2 may be omitted as needed or desired, or an additional barrier layer may be further disposed on the second barrier layer BR2.

The first bottom metal layer BMC1 may overlap with the transistor T1. The first bottom metal layer BMC1 may be a shielding electrode. The first bottom metal layer BMC1 may protect a semiconductor pattern, a conductive pattern, or the like by blocking light incident onto the transistor T1 and the like from below the display layer 100. The first bottom metal layer BMC1 may include a conductive material. In an embodiment, a sensing line may be placed at (e.g., in or on) the same layer as that of the first bottom metal layer BMC1 in a partial region in a peripheral region. In other words, the sensing line may be disposed at (e.g., in or on) the same layer as that of the first bottom metal layer BMC1 in a partial region. The sensing line and the first bottom metal layer BMC1 may be formed in the same process as each other. However, the present disclosure is not limited thereto, and the sensing line and the first bottom metal layer BMC1 may be disposed at (e.g., in or on) the same layer as each other, and formed in different processes from each other.

In an embodiment, the first barrier layer BR1 and the second barrier layer BR2 disposed with the bottom metal layer BMC1 therebetween may each include a plurality of sub layers, which are stacked. The plurality of sub layers may each be an inorganic layer. For example, the plurality of sub layers may each be a silicon oxide layer, a silicon nitride layer, a silicon oxynitride layer, an amorphous silicon layer, or the like. In addition, in an embodiment, the circuit layer DP_CL may further include an organic layer disposed to be adjacent to the first barrier layer BR1 or the second barrier layer BR2 in addition to the inorganic layer such as the first barrier layer BR1 and the second barrier layer BR2.

In a case in which the first barrier layer BR1 or the second barrier layer BR2 disposed to be adjacent to the first bottom metal layer BMC1 includes the plurality of sub layers, a coupling between the first bottom metal layer BMC1 and another conductive pattern may be further effectively prevented.

The buffer layer BFL may be disposed on the barrier layers BR1 and BR2. The buffer layer BFL improves a bonding force between the base layer BL and a semiconductor pattern and/or a conductive pattern. The buffer layer BFL may include at least one of a silicon oxide layer or a silicon nitride layer. For example, in an embodiment, the buffer layer BFL may include a silicon oxide layer and a silicon nitride layer, and the silicon oxide layer and the silicon nitride layer may be alternately stacked.

A first semiconductor pattern may be disposed on the buffer layer BFL. The first semiconductor pattern may include a silicon semiconductor. For example, the silicon semiconductor may include amorphous silicon, polycrystalline silicon, and/or the like. For example, the first semiconductor pattern may include a low-temperature polycrystalline silicon.

FIG. 6 illustrates a portion of the first semiconductor pattern disposed on the buffer layer BFL, and another portion of the first semiconductor pattern may be further disposed in another region. The first semiconductor pattern may be arranged according to a desired rule (e.g., a specific or predetermined rule) across the pixels. The first semiconductor pattern may have a different electrical property according to whether the first semiconductor pattern is doped or not. The first semiconductor pattern may include a first region having a high conductivity, and a second region having a low conductivity. The first region may be doped with an N-type dopant or a P-type dopant. A P-type transistor may include a doped region doped with a P-type dopant, and an N-type transistor may include a doped region doped with an N-type dopant. The second region may be an undoped region or a region that is doped with a lower concentration compared to that of the first region.

A conductivity of the first region may be greater than a conductivity of the second region, and the first region may substantially serve as an electrode or a signal line. The second region may substantially correspond to an active region (e.g., a channel) of a transistor. In other words, a portion of the semiconductor pattern may be an active region of a transistor, another portion may be a source or drain of a transistor, and another portion may be a connection electrode or a connection signal line.

A first electrode S1 (e.g., a source), an active region A1 (e.g., a channel), and a second electrode D1 (e.g., a drain) of the first transistor T1 are formed from the first semiconductor pattern. The first electrode S1 and the second electrode D1 of the first transistor T1 extend in opposite directions from each other from the active region A1.

FIG. 6 illustrates a portion of a connection signal line CSL that is formed from the first semiconductor pattern. In another view, the connection signal line CSL may be connected to the second electrode of the fifth transistor T5 (e.g., see FIG. 5) and the second emission control transistor ET2 (e.g., in a plan view).

The circuit layer DP_CL may include a plurality of insulating layers disposed on the base layer BL. The circuit layer DP_CL may include a lower insulating layer IL-L (e.g., see FIG. 9) and an upper insulating layer IL-U. The upper insulating layer IL-U (e.g., see FIG. 9) may be a layer including an organic material.

In an embodiment, the circuit layer DP_CL may include a plurality of inorganic insulating layers and a plurality of organic insulating layers. In addition, hereinafter, the plurality of inorganic insulating layers may be referred to as a lower insulating layer, and the plurality of organic insulating layers may be referred to as an upper insulating layer. The circuit layer DP_CL may further include the buffer layer BFL and the barrier layers BR1 and BR2 disposed below the lower insulating layer and the like.

Referring to FIG. 6, a first insulating layer 10 may be disposed on the buffer layer BFL. The first insulating layer 10 may overlap with a plurality of pixels in common, and may cover the first semiconductor pattern. The first insulating layer 10 may be an inorganic layer and/or an organic layer, and may have a single-layer structure or a multi-layered structure. The first insulating layer 10 may include at least one of aluminum oxide, titanium oxide, silicon oxide, silicon nitride, silicon oxynitride, zirconium oxide, or hafnium oxide. In an embodiment, the first insulating layer 10 may be a single-layer silicon oxide layer. An insulating layer of the circuit layer DP_CL to be described in more detail below may be an inorganic layer and/or an organic layer, and may have a single-layer structure or a multi-layered structure, as well as the first insulating layer 10. The inorganic layer may include at least one of the inorganic materials described above, but the present disclosure is not limited thereto. For example, in an embodiment, the first insulating layer 10 may be an inorganic insulating layer.

A third electrode G1 (e.g., a gate) of the first transistor T1 is disposed on the first insulating layer 10. The third electrode G1 may be a portion of a metal pattern. The third electrode G1 of the first transistor T1 overlaps with the active region A1 of the first transistor T1. In a process of doping the first semiconductor pattern, the third electrode G1 of the first transistor T1 may function as a mask. The third electrode G1 of the first transistor T1 may include titanium (Ti), silver (Ag), a silver-containing alloy, molybdenum (Mo), a molybdenum-containing alloy, aluminum (Al), an aluminum-containing alloy, aluminum nitride (AlN), tungsten (W), tungsten nitride (WN), copper (Cu), indium tin oxide (ITO), indium zinc oxide (IZO), and/or the like, but the present disclosure is not particularly limited thereto.

A second insulating layer 20 may be disposed on the first insulating layer 10, and may cover the third electrode G1 of the first transistor T1. The second insulating layer 20 may be an inorganic layer and/or an organic layer, and may have a single-layer structure or a multi-layered structure. The second insulating layer 20 may include at least one of silicon oxide, silicon nitride, or silicon oxynitride. In an embodiment, the second insulating layer 20 may have a multi-layered structure including a silicon oxide layer and a silicon nitride layer. For example, in an embodiment, the second insulating layer 20 may be an inorganic insulating layer.

An upper electrode UE and a second bottom metal layer BMC2 may be disposed on the second insulating layer 20. The upper electrode UE may overlap with the third electrode G1. The upper electrode UE may be a portion of a metal pattern. A portion of the third electrode G1 and the upper electrode UE overlapping with the portion of the third electrode G1 may define the capacitor Cst (e.g., see FIG. 5). In an embodiment of the present disclosure, the second insulating layer 20 may be replaced with an insulating pattern. In this case, the upper electrode UE may be disposed on the insulating pattern, and the upper electrode UE may serve as a mask for forming the insulating pattern from the second insulating layer 20.

The second bottom metal layer BMC2 may be disposed below an oxide thin-film transistor (e.g., the third transistor T3). The second bottom metal layer BMC2 may be applied with a constant or substantially constant voltage or a signal.

A third insulating layer 30 may be disposed on the second insulating layer 20, and may cover the upper electrode UE and the second bottom metal layer BMC2. The third insulating layer 30 may have a single-layer structure or a multi-layered structure. For example, the third insulating layer 30 may have a multi-layered structure including a silicon oxide layer and a silicon nitride layer. In an embodiment, the third insulating layer 30 may be an inorganic insulating layer.

A second semiconductor pattern may be disposed on the third insulating layer 30. The second semiconductor pattern may include an oxide semiconductor. The oxide semiconductor may include a plurality of regions divided from each other according to whether a metal oxide is reduced or not. A region (hereinafter, a reduced region) in which the metal oxide is reduced has a greater conductivity compared to that of a region (hereinafter, a non-reduced region) in which the metal oxide is not reduced. The reduced region substantially serves as a source/drain of a transistor or a signal line. The non-reduced region substantially corresponds to an active region (e.g., a semiconductor region, such as a channel) of a transistor. In other words, a portion of the second semiconductor pattern may be an active region of a transistor, another portion may be a source/drain region of a transistor, and another portion may be a signal transfer region.

A first electrode S3 (e.g., a source), an active region A3 (e.g., a channel), and a second electrode D3 (e.g., a drain) of the third transistor T3 are formed from the second semiconductor pattern. The first electrode S3 and the second electrode D3 include a metal that is reduced from a metal oxide semiconductor. The first electrode S3 and the second electrode D3 may extend in opposite directions from each other from the active region A3 in a cross-sectional view.

A fourth insulating layer 40 may be disposed on the third insulating layer 30. The fourth insulating layer 40 may overlap with the plurality of pixels in common, and may cover the second semiconductor pattern. The fourth insulating layer 40 may include at least one of aluminum oxide, titanium oxide, silicon oxide, silicon nitride, silicon oxynitride, zirconium oxide, or hafnium oxide. For example, the fourth insulating layer 40 may be an inorganic insulating layer.

A third electrode G3 (e.g., a gate) of the third transistor T3 is disposed on the fourth insulating layer 40. The third electrode G3 may be a portion of a metal pattern. The third electrode G3 of the third transistor T3 overlaps with the active region A3 of the third transistor T3. In a process of reducing the second semiconductor pattern, the third electrode G3 may function as a mask. In an embodiment of the present disclosure, the fourth insulating layer 40 may be replaced with an insulating pattern.

A fifth insulating layer 50 may be disposed on the fourth insulating layer 40, and may cover the third electrode G3. The fifth insulating layer 50 may be an inorganic layer.

A first connection electrode CNE10 may be disposed on the fifth insulating layer 50. The first connection electrode CNE10 may be connected to the connection signal line CSL through a first contact hole CH1 passing through (e.g., penetrating) the first to fifth insulating layers 10, 20, 30, 40, and 50.

A sixth insulating layer 60 may be disposed on the fifth insulating layer 50. The sixth insulating layer 60 may be an organic insulating layer. The organic insulating layer may include a general-purpose polymer, such as benzocyclobutene (BCB), polyimide, hexamethyldisiloxane (HMDSO), polymethylmethacrylate (PMMA), or polystyrene (PS), a polymer derivative having a phenol-based group, an acrylic polymer, an imide-based polymer, an arylether-based polymer, an amide-based polymer, a fluorine-based polymer, a p-xylene-based polymer, a vinyl alcohol-based polymer, and/or the like, or a suitable blend thereof, but the present disclosure is not particularly limited thereto.

A second connection electrode CNE20 may be disposed on the sixth insulating layer 60. The second connection electrode CNE20 may be connected to the first connection electrode CNE10 through a second contact hole CH2 passing through (e.g., penetrating) the sixth insulating layer 60. A seventh insulating layer 70 may be disposed on the sixth insulating layer 60, and may cover the second connection electrode CNE20. The seventh insulating layer 70 may be an organic insulating layer.

A third connection electrode CNE30 may be disposed on the seventh insulating layer 70. The third connection electrode CNE30 may be connected to the second connection electrode CNE20 through a third contact hole CH3 passing through (e.g., penetrating) the seventh insulating layer 70. An eighth insulating layer 80 may be disposed on the seventh insulating layer 70, and may cover the third connection electrode CNE30. The eighth insulating layer 80 may be an organic insulating layer.

In an embodiment, the sixth insulating layer 60, the seventh insulating layer 70, and the eighth insulating layer 80 may each be referred to as an organic insulating layer. In addition, the sixth insulating layer 60, the seventh insulating layer 70, and the eighth insulating layer 80, which are sequentially stacked, may be referred to as an upper insulating layer.

The circuit layer DP_CL may further include the sensor driving circuit O_SD (e.g., see FIG. 5). For convenience of illustration, FIG. 6 shows the reset transistor ST1 in the sensor driving circuit O_SD. A first electrode STS1, an active region STA1, and a second electrode STD1 of the reset transistor ST1 are formed from the second semiconductor pattern. The first electrode STS1 and the second electrode STD1 include a metal that is reduced from a metal oxide semiconductor. The fourth insulating layer 40 is disposed to cover the first electrode STS1, the active region STA1, and the second electrode STD1 of the reset transistor ST1. A third electrode STG1 of the reset transistor ST1 is disposed on the fourth insulating layer 40. In an embodiment, the third electrode STG1 may be a portion of a metal pattern. The third electrode STG1 of the reset transistor ST1 overlaps with the active region STA1 of the reset transistor ST1.

As an example, the reset transistor ST1 and the third transistor T3 may be disposed at (e.g., in or on) the same layer as each other. In other words, the first electrode STS1, the active region STA1, and the second electrode STD1 of the reset transistor ST1, and the first electrode S3, the active region A3, and the second electrode D3 of the third transistor T3 may be formed through the same process as each other. The third electrode STG1 of the reset transistor ST1 and the third electrode G3 of the third transistor T3 may be concurrently or substantially simultaneously formed with each other through the same process. In some embodiments, the first electrode and the second electrode of the output transistor ST3 and the amplifying transistor ST2 of the sensor driving circuit O_SD may be formed through the same process as that for the first electrode S1 and the second electrode D1 of the first transistor T1. Because the reset transistor ST1 and the third transistor T3 may be formed at (e.g., in or on) the same layer as each other through the same process, no additional process for forming the reset transistor ST1 may be required or used, thereby improving a process efficiency and reducing costs.

The circuit layer DP_CL may include the buffer layer BFL, the plurality of inorganic insulating layers 10, 20, 30, 40, and 50, the plurality of organic insulating layers 60, 70, and 80, and a plurality of conductive patterns. In the active region DA (e.g., see FIG. 3), the conductive patterns may include the transistors T1, T3, and ST1, the capacitor Cst (e.g., see FIG. 5), the bottom metal layers BMC1 and BMC2 below the transistors and overlapping with the transistors, and the plurality of connection electrodes CNE10, CNE20, and CNE30 electrically connected to a light-emitting element ED or a sensing element OPD. In addition, in the peripheral region NDA (e.g., see FIG. 3), the conductive patterns may include the data lines DL1 to DLm and the sensing lines RL1 to RLh.

The element layer DP_ED may be disposed on the circuit layer DP_CL. The element layer DP_ED may include a pixel-defining film PDL, the light-emitting element ED, and the sensing element OPD. The element layer DP_ED may include a plurality of sensing elements OPD and a plurality of light-emitting elements ED divided by the pixel-defining film PDL. FIG. 6 illustrates one light-emitting element ED and one sensing element OPD as a representative example.

A light-emitting region PXA may be defined to correspond to the light-emitting element ED, and a sensing region SA may be defined to correspond to the sensing element OPD. The light-emitting region PXA and the sensing region SA may each be defined by the pixel-defining film PDL described in more detail below.

The light-emitting element ED may include a first electrode AE, a first functional layer HFL, an emission layer EL, a second functional layer EFL, and a second electrode CE. The sensing element OPD may include a first electrode AE-S, a first functional layer HFL, a photoelectric conversion layer LRL, a second functional layer EFL, and a second electrode CE. The first functional layer HFL, the second functional layer EFL, and the second electrode CE may be provided in common to the pixels PX and the plurality of sensors FX. Hereinafter, the first electrode AE of the light-emitting element ED may be referred to as a first light-emitting part electrode, and the first electrode AE-S of the sensing element OPD may be referred to as a first sensing part electrode.

Referring to FIG. 6, the first electrode AE of the light-emitting element ED and the first electrode AE-S of the sensing element OPD are disposed on the eighth insulating layer 80. The first electrode AE of the light-emitting element ED may be connected to the third connection electrode CNE30 through a fourth contact hole CH4 passing through (e.g., penetrating) the eighth insulating layer 80.

The light-emitting element ED may further include an auxiliary layer SL. The auxiliary layer SL may be disposed in common in the light-emitting region PXA and the sensing region SA. The auxiliary layer SL may be disposed between the first functional layer HFL and the emission layer EL, and between the first functional layer HFL and the photoelectric conversion layer LRL. In an embodiment of the present disclosure, the auxiliary layer SL may be omitted.

The pixel-defining film PDL may be disposed on the eighth insulating layer 80, and may cover a portion of each of the first electrodes AE and AE-S. Openings OP1 and OP2 are defined in the pixel-defining film PDL. A plurality of light-emitting regions PXA and a plurality of sensing regions SA may be divided from each other, and may be defined by the openings OP1 and OP2.

The pixel-defining film PDL may be formed of a polymer resin. For example, the pixel-defining film PDL may include a polyacrylate-based resin or a polyimide-based resin. In addition, the pixel-defining film PDL may further include an inorganic material, in addition to a polymer resin. The pixel-defining film PDL may include a light absorbing material, or may include a black pigment or a black dye. The pixel-defining film PDL including the black pigment or the black dye may embody a black pixel-defining film. When forming the pixel-defining film PDL, carbon black, aniline black, or the like may be used as the black pigment or the black dye, but the present disclosure is not limited thereto. In addition, the pixel-defining film PDL may be formed by mixing a blue organic material and a black organic material. The pixel-defining film PDL may further include a liquid-repellent organic material.

The light-emitting region PXA may be defined by a first opening OP1 of the pixel-defining film PDL, and the sensing region SA may be defined by a second opening OP2. The first opening OP1 may expose at least a portion of the first electrode AE of the light-emitting element ED, and the second opening OP2 may expose at least a portion of the first electrode AE-S of the sensing element OPD.

The emission layer EL of the light-emitting element ED may be disposed in a region corresponding to the first opening OP1. The emission layer EL may generate a desired color of light (e.g., a predetermined color of light). In an embodiment, the emission layer EL that is patterned to correspond to the first opening OP1 is illustrated as an example, but one emission layer may be disposed in common in a plurality of light-emitting regions. In this case, the one emission layer may generate white light or blue light. In addition, the emission layer may have a multi-layered structure that is referred to as tandem.

The emission layer EL may include a low molecular organic material or a polymer organic material as a light-emitting material. As another example, the emission layer EL may include a quantum dot material as a light-emitting material. A core of a quantum dot may be selected from a group II-VI compound, a group III-VI compound, a group I-III-VI compound, a group III-V compound, a group III-II-V compound, a group I IV-VI compound, a group IV element, a group IV compound, and/or a suitable combination thereof.

The photoelectric conversion layer LRL may be disposed in a region corresponding to the second opening OP2. The photoelectric conversion layer LRL may include an organic photo sensing material. The second electrode CE may be disposed on the photoelectric conversion layer LRL. The first electrode AE-S and the second electrode CE may each receive an electrical signal. The first electrode AE-S and the second electrode CE may receive different signals. Thus, an electric field (e.g., a predetermined electric field) may be formed between the first electrode AE-S and the second electrode CE. The photoelectric conversion layer LRL generates an electrical signal corresponding to light incident onto the sensor.

A charge that is generated in the photoelectric conversion layer LRL changes the electric field between the first electrode AE-S and the second electrode CE. The amount of charges that are generated in the photoelectric conversion layer LRL may vary according to whether light is incident onto the sensing element OPD or not, and the amount and the intensity of the light incident onto the sensing element OPD. Accordingly, the electric field that is formed between the first electrode AE-S and the second electrode CE may vary. The sensing element OPD according to an embodiment of the present disclosure may obtain fingerprint information of a user through a change in the electrical field between the first electrode AE-S and the second electrode CE.

In some embodiments, the element layer DP_ED may further include a capping layer disposed on the second electrode CE. The capping layer may serve to improve a light emission efficiency according to the principle of constructive interference. For example, the capping layer may include a suitable material having a refractive index of about 1.6 or more with respect to light having a wavelength of about 589 nm. The capping layer may be an organic capping layer including an organic material, an inorganic capping layer including an inorganic material, or a composite capping layer including an organic material and an inorganic material. For example, the capping layer may include a carbocyclic compound, a heterocyclic compound, an amine group-containing compound, a porphine derivative, a phthalocyanine derivative, a naphthalocyanine derivative, an alkali metal complex, an alkaline earth metal complex, or any suitable combination thereof. The carbocyclic compound, the heterocyclic compound, and the amine group-containing compound may be optionally substituted with a substituent including O, N, S, Se, Si, F, Cl, Br, I, or any suitable combination thereof.

The encapsulation layer TFE is disposed on the element layer DP_ED. The encapsulation layer TFE includes at least one inorganic layer and at least one organic layer. In an embodiment of the present disclosure, the encapsulation layer TFE may include two inorganic encapsulation layers, and an organic encapsulation layer disposed therebetween. In an embodiment of the present disclosure, the encapsulation layer TFE may include a plurality of organic layers and a plurality of inorganic layers, which are alternately stacked.

The inorganic encapsulation layers protects the light-emitting element ED and the sensing element OPD from moisture/oxygen, and the organic encapsulation layer protects the light-emitting element ED and the sensing element OPD from foreign substances such as dust particles. The inorganic encapsulation layer may include a silicon nitride layer, a silicon oxynitride layer, a silicon oxide layer, a titanium oxide layer, an aluminum oxide layer, or the like, but is not particularly limited thereto. The organic encapsulation layer may include an acrylic organic layer, but is not particularly limited thereto.

The display device 1000 may further include the sensor layer 200 and an optical layer 300.

The sensor layer 200 may be disposed on the display layer 100. The sensor layer 200 may sense an external input applied from the outside. The external input may be a user's input. The user's input may include various suitable external inputs in various forms, such as a user's body part, a pen, light, heat, or pressure. The sensor layer 200 may be referred to as a sensor, an input sensing layer, or an input sensing panel. The sensor layer 200 may include a sensor base layer 201, a first sensor conductive layer 202, a sensor insulating layer 203, a second sensor conductive layer 204, and a sensor cover layer 205.

In an embodiment, the sensor layer 200 may be formed on the display layer 100 through a continuous process. In other words, the sensor layer 200 may be directly disposed on the display layer 100. However, the present disclosure is not limited thereto.

In an embodiment, the sensor base layer 201 may be directly disposed on the display layer 100. The sensor base layer 201 may be an inorganic layer including at least one of silicon nitride, silicon oxynitride, or silicon oxide. As another example, the sensor base layer 201 may be an organic layer including an epoxy resin, an acryl resin, or an imide-based resin. The sensor base layer 201 may have a single-layer structure or a multi-layered structure in which a plurality of layers are stacked along the third direction DR3.

The first sensor conductive layer 202 and the second sensor conductive layer 204 may each have a single-layer structure or a multi-layered structure in which a plurality of layers are stacked along the third direction DR3.

The sensor conductive layers 202 and 204 having the single-layer structure may include a metal layer or a transparent conductive layer. The metal layer may include molybdenum, silver, titanium, copper, aluminum, or a suitable alloy thereof. The transparent conductive layer may include a transparent conductive oxide, such as indium tin oxide, indium zinc oxide, zinc oxide, or indium zinc tin oxide. In addition, the transparent conductive layer may include a conductive polymer such as PEDOT, a metal nanowire, graphene, and/or the like.

The sensor conductive layers 202 and 204 having the multi-layered structure may have a structure in which a transparent conductive layer and a metal layer are stacked, or a structure in which a plurality of metal layers including different metals are stacked. The metal layers may have, for example, a triple-layered structure of titanium/aluminum/titanium. The conductive layer having the multi-layered structure may include at least one metal layer and at least one transparent conductive layer.

The sensor insulating layer 203 may be disposed between the first sensor conductive layer 202 and the second sensor conductive layer 204. The sensor insulating layer 203 may include an inorganic film. The inorganic film may include at least one of aluminum oxide, titanium oxide, silicon oxide, silicon nitride, silion oxynitride, zirconium oxide, or hafnium oxide.

As another example, the sensor insulating layer 203 may include an organic film. The organic film may include at least one of an acrylic resin, a methacrylic resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin.

The sensor cover layer 205 may be disposed on the sensor insulating layer 203, and may cover the second sensor conductive layer 204. The second sensor conductive layer 204 may include a conductive pattern. The sensor cover layer 205 may cover the conductive pattern, and may reduce or minimize a probability that the conductive pattern will be damaged in a subsequent process. The sensor cover layer 205 may include an inorganic material. For example, the sensor cover layer 205 may include silicon nitride, but the present disclosure is not particularly limited thereto. In an embodiment of the present disclosure, the sensor cover layer 205 may be omitted.

The optical layer 300 may be disposed on the sensor layer 200. The optical layer 300 may be a reflection reduction layer that reduces a reflectance due to external light incident from the outside. The optical layer 300 may be formed on the sensor layer 200 through a continuous process. For example, the optical layer 300 may include a polarizing film including a retarder and/or a polarizer, a multi-layered reflective layers that cause a destructive interference of reflected light, a color filter disposed in consideration of an arrangement of a pixel and a sensor included in the display layer 100, or the like. The optical layer 300 may selectively absorb light of a partial band among light reflected inside an electronic device and/or a display panel, or light incident from the outside of the electronic device and/or the display panel.

Referring to FIG. 6, in an embodiment, the optical layer 300 may include a division layer 310, a plurality of color filters 320, and a planarization layer 330.

The division layer 310 may be disposed to overlap with the conductive pattern of the second sensor conductive layer 204. The sensor cover layer 205 may be disposed between the division layer 310 and the second sensor conductive layer 204. The division layer 310 may prevent external light reflection due to the second sensor conductive layer 204. A material included in the division layer 310 is not particularly limited, as long as the material absorbs light. The division layer 310 may be a layer having a black color, and in an embodiment, the division layer 310 may include a black coloring agent. The black coloring agent may include a black dye or a black pigment. The black coloring agent may include carbon black, a metal such as chromium, or an oxide thereof.

A plurality of division openings OP-300 may be defined in the division layer 310. The plurality of division openings OP-300 may overlap with the emission layer EL and the photoelectric conversion layer LRL, respectively. The color filters 320 may be disposed to correspond to the plurality of division openings OP-300. The color filter 320 may transmit light that is provided from the emission layer EL overlapping with the color filter 320. As another example, light may be transmitted through the color filter 320, and may be provided to the photoelectric conversion layer LRL.

In an embodiment, one color filter 320 may be provided in common to the emission layer EL and the photoelectric conversion layer LRL. However, the present disclosure is not limited thereto. In an embodiment, a color filter of which a color is different from that of a color filter disposed on the emission layer EL may be disposed on the photoelectric conversion layer LRL. As another example, the color filter 320 may not be disposed on the photoelectric conversion layer LRL.

For example, the emission layer EL illustrated in FIG. 6 may be a green light emission layer, and the color filter 320 may be a green color filter. On the photoelectric conversion layer LRL, a green color filter may be disposed, a color filter of which a color is not green may be disposed, or a color filter may not be disposed.

In some embodiments, a kinds of a color filter disposed on the emission layer EL may vary according to a color of the light that is emitted from the emission layer EL. A red color filter may be disposed on an emission layer that emits red light, and a blue color filter or a transparent filter may be disposed on an emission layer that emits blue light.

The planarization layer 330 may cover the division layer 310 and the color filter 320. The planarization layer 330 may include an organic material, and may provide a flat or substantially flat surface to an upper surface of the planarization layer 330. In an embodiment, the planarization layer 330 may be omitted.

Figure 7:
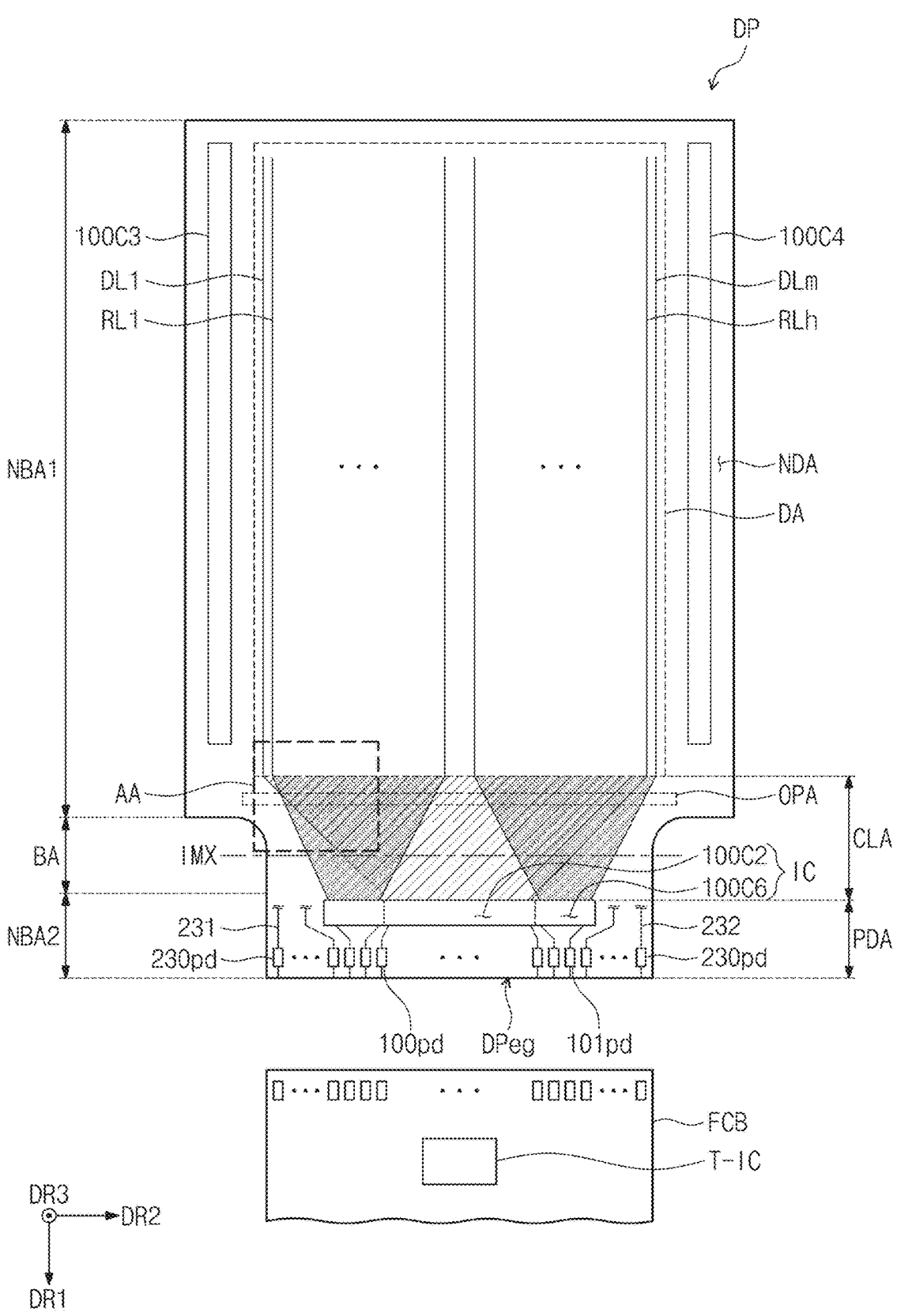
FIG. 7 is a plan view illustrating a display panel according to an embodiment of the present disclosure.

FIG. 7 is a plan view illustrating the display panel DP according to an embodiment of the present disclosure. FIG.

Figure 8:
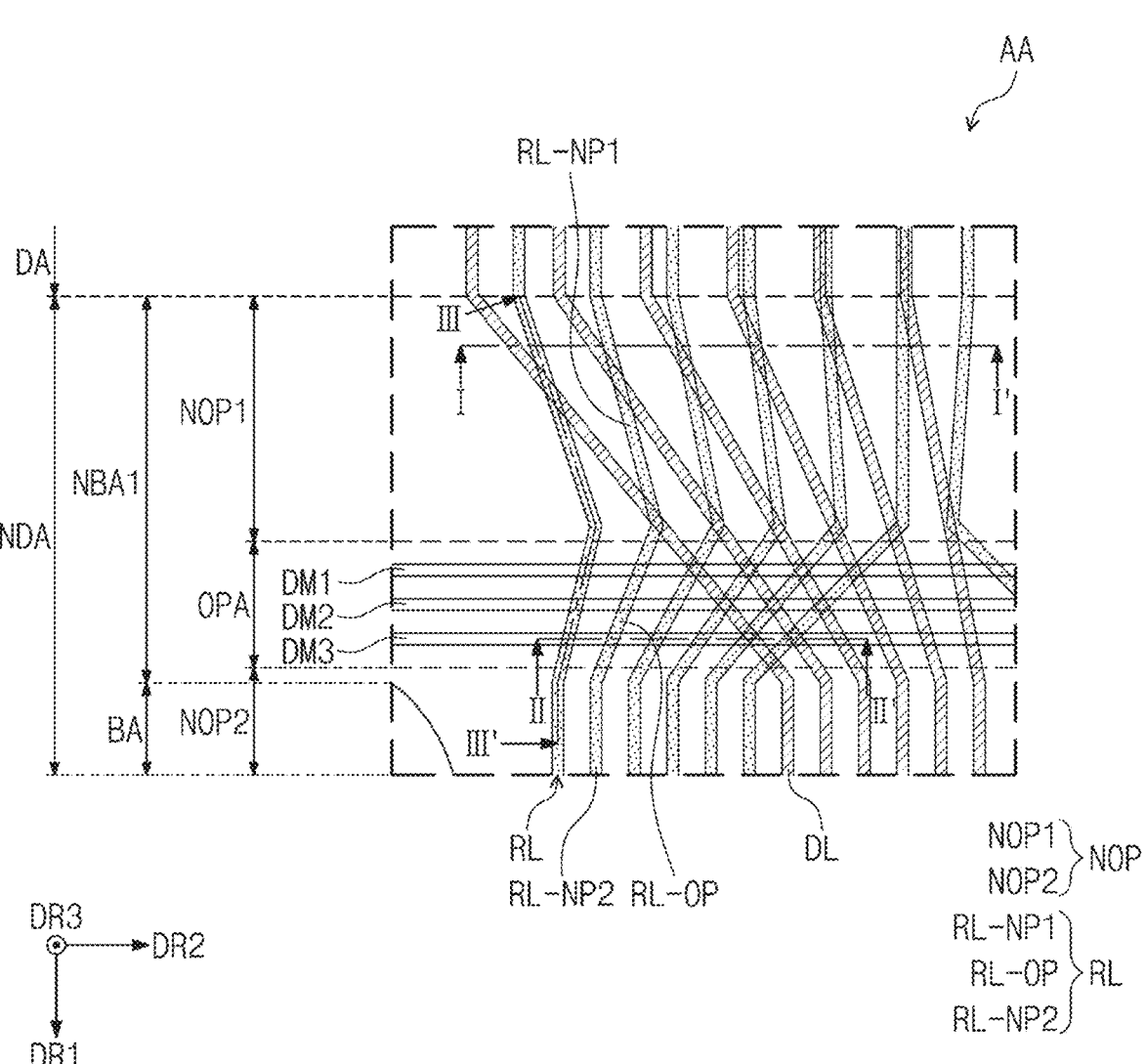
FIG. 8 is an enlarged plan view illustrating a portion of a display panel according to an embodiment of the present disclosure.

8 is an enlarged plan view illustrating a portion of a display panel according to an embodiment of the present disclosure. FIG. 8 may be an enlarged view of the region AA of FIG. 7.

The display panel DP may be divided into an active region DA, and a peripheral region NDA adjacent to the active region DA. The peripheral region NDA disposed on at least one side of the active region DA may include a wiring region CLA and a pad region PDA. The wiring region CLA may be disposed on one side of the active region DA, and the pad region PDA may be disposed to be adjacent to one side of the wiring region CLA.

Referring to FIGS. 3 and 7, the data lines DL1 to DLm and the sensing lines RL1 to RLh may be disposed in the active region DA and the peripheral region NDA of the display panel DP. The data lines DL1 to DLm may be electrically connected to the plurality of pixels PX in the active region DA, and may extend to the peripheral region NDA. The sensing lines RL1 to RLh may be electrically connected to the plurality of sensors FX in the active region DA, and may extend to the peripheral region NDA. In an embodiment, the data lines DL1 to DLm and the sensing lines RL1 to RLh may extend from the active region DA toward the peripheral region NDA (e.g., a part thereof) adjacent to the active region DA in the first direction DR1.

In other words, in the display panel DP according to an embodiment, the data lines DL1 to DLm may be electrically connected to the light-emitting element ED (e.g., see FIG. 6), and may be arranged extending from the active region DA to the wiring region CLA. Similarly, the sensing lines RL1 to RLh may be electrically connected to the sensing element OPD (e.g., see FIG. 6), and may be arranged extending from the active region DA to the wiring region CLA.

In the display panel DP according to an embodiment, a partial region of the display panel DP may be bent. The display panel DP may include a first non-bending region NBA1, a second non-bending region NBA2 spaced apart from the first non-bending region NBA1 in the first direction DR1, and a bending region BA defined between the first non-bending region NBA1 and the second non-bending region NBA2. The first non-bending region NBA1 may include the active region DA and a partial part of the peripheral region NDA. The peripheral region NDA may include the bending region BA and the second non-bending region NBA2.

The bending region BA may be bent along a virtual axis IMX extending in the second direction DR2. When the bending region BA is bent, the second non-bending region NBA2 may face the first non-bending region NBA1. In other words, the bending region BA may be bent so that the second non-bending region NBA2 is placed below (e.g., located underneath) the first non-bending region NBA1 with respect to the third direction DR3. In the display panel DP according to an embodiment, a width of the bending region BA in the second direction DR2 may be smaller than a width of the first non-bending region NBA1 in the second direction DR2. A width of the second non-bending region NBA2 in the second direction DR2 may be smaller than the width of the first non-bending region NBA1 in the second direction DR2.

A driving chip IC may be mounted on the display panel DP, and may be connected to each of the data lines DL1 to DLm and the sensing lines RL1 to RLh. The driving chip IC may be disposed in the pad region PDA. The driving chip IC may drive the plurality of pixels PX and the plurality of sensors FX. For example, the driving chip IC may include the data driver 100C2 and the sensor controller 100C6.

The data lines DL1 to DLm and the sensing lines RL1 to RLh may each extend from the first non-bending region NBA1 to the second non-bending region NBA2 via the bending region BA. The data lines DL1 to DLm and the sensing lines RL1 to RLh may each be electrically connected to a pad part disposed to be adjacent to an end of the second non-bending region NBA2. The pad part may be disposed to be adjacent to an edge DPeg of the display panel DP. The pad part may include pads 100pd for a display that are respectively connected to the data lines DL1 to DLm, pads 101pd for a sensor that are respectively connected to the sensing lines RL1 to RLh, and pads 230pd for a touch that are respectively electrically connected to the first trace lines 231 and the second trace lines 232.

A flexible circuit film FCB may be electrically connected to the pad part. The flexible circuit film FCB may be attached to the pad part through a conductive adhesive film and/or the like, and thus the display panel DP and the flexible circuit film FCB may be electrically connected to each other. A touch driving chip T-IC to drive the sensor layer 200 may be mounted on the flexible circuit film FCB.

Referring to FIGS. 7 and 8, the wiring region CLA may include an open region OPA. The wiring region CLA may include a first region NOP1 adjacent to the active region DA, and a second region NOP2 spaced apart from the first region NOP1 in the first direction DR1 with the open region OPA therebetween.

In an embodiment, the open region OPA may be a region in which organic insulating layers are removed. The open region OPA may be a portion in which an upper insulating layer IL-U (e.g., see FIG. 11), which is the organic insulating layers among the insulating layers of the circuit layer DP_CL (e.g., see FIG. 6) described above, is removed. For example, the sixth insulating layer to the eighth insulating layer 60, 70, and 80 (e.g., see FIG. 6) may not be disposed in the open region OPA, unlike in the adjacent first region NOP1 and second region NOP2.

The first region NOP1 and the second region NOP2 may be referred to as a non-open region NOP. The non-open region NOP may be a portion disposed in the wiring region CLA to be adjacent to the open region OPA. For example, the sixth insulating layer to the eighth insulating layer 60, 70, and 80 (e.g., see FIG. 6) may be disposed in the non-open region NOP.

The open region OPA may be placed between the active region DA and the bending region BA. The bending region BA may include the second region NOP2.

A portion of the sensing lines RL1 to RLh disposed in the peripheral region NDA may overlap with the data lines DL1 to DLm. In an embodiment, a portion of the sensing lines RL1 to RLh may not overlap with the data lines DL1 to DLm in the wiring region CLA.

In addition, at least a portion of the data lines DL1 to DLm and at least a portion of the sensing lines RL1 to RLh may overlap with each other in the wiring region CLA. In an embodiment, the data lines DL1 to DLm and the sensing lines RL1 to RLh may be disposed at (e.g., in or on) different layers from each other.

In an embodiment, the data lines DL1 to DLm disposed in the wiring region CLA may be disposed at (e.g., in or on) the same layer as that of any one of the electrodes constituting a capacitor, or any one of the electrodes constituting a transistor, which are disposed in the circuit layer DP_CL (e.g., see FIG. 6). For example, the data lines DL1 to DLm may be disposed at (e.g., in or on) the same layer as that of the third electrode G1 of the first transistor T1, the upper electrode UE, or the third electrode G3 of the third transistor T3 illustrated in FIG. 6.

In addition, in an embodiment, the sensing lines RL1 to RLh disposed in the wiring region CLA may be disposed below (e.g., under) the data lines DL1 to DLm in the open region OPA, and may be disposed above the data lines DL1 to DLm in the non-open region NOP. For example, the sensing lines RL1 to RLh may be disposed at (e.g., in or on) the same layer as that of the first bottom metal layer BMC1 illustrated in FIG. 6 in the open region OPA, and may be disposed at (e.g., in or on) the same layer as that of the second connection electrode CNE20 illustrated in FIG. 6 in the non-open region NOP.

A display device according to an embodiment may further include a shielding pattern disposed between the data lines DL1 to DLm and the sensing lines RL1 to RLh. In the open region OPA, the shielding pattern may be disposed below (e.g., under) the data lines DL1 to DLm, and may be disposed below (e.g., under) inorganic insulating layers or between the inorganic insulating layers. For example, in the open region OPA, the shielding pattern may be disposed below the buffer layer BFL. However, the present disclosure is not limited thereto, and in the open region OPA, the shielding pattern may be disposed to be spaced apart from the data lines DL1 to DLm in the third direction DR3 that is the thickness direction, with an inorganic insulating layer disposed below (e.g., under) the data lines DL1 to DLm therebetween.

In the non-open region NOP, the shielding pattern may be disposed below (e.g., under) the sensing lines RL1 to RLh. In addition, in the non-open region NOP, the shielding pattern may be disposed above the inorganic insulating layers. For example, in the open region OPA, the shielding pattern may be disposed at (e.g., in or on) the same layer as that of the first connection electrode CNE10.

However, the present disclosure is not limited thereto, and an arrangement relationship of the sensing lines RL1 to RLh and the data lines DL1 to DLm in the peripheral region NDA, an arrangement position of the shielding pattern, and/or the like will be described in more detail below with reference to FIGS. 9 to 11.

Referring to FIG. 8, the display panel according to an embodiment may further include one or more dam parts. One or more dam parts DM1, DM2, and DM3 may be disposed in the peripheral region NDA. In an embodiment, the dam part(s) DM1, DM2, and DM3 may be disposed in the open region OPA.

The dam part DM1, DM2, and DM3 may include the same material as that of at least a portion of the materials included in the organic insulating layers 60, 70, and 80 (e.g., see FIG. 6) described above. The dam part DM1, DM2, and DM3 may include at least one layer including the same material as that of at least one of the layers included in the organic insulating layers 60, 70, and 80 (e.g., see FIG. 6) corresponding to the upper insulating layer IL-U (e.g., see FIG. 9).

The dam part DM1, DM2, and DM3 may overlap with a sensing line RL and a data line DL. The dam part DM1, DM2, and DM3 may be arranged extending parallel to or substantially parallel to the second direction DR2.

FIG. 8 illustrates three dam parts DM1, DM2, and DM3 that are sequentially disposed along the first direction DR1, but the present disclosure is not limited thereto, and additional dam parts may be further included, or at least one of the dam parts DM1, DM2, or DM3 may be excluded.

In addition, FIG. 8 illustrates that the dam parts DM1, DM2, and DM3 are formed to have a stripe form (e.g., a stripe shape) that is parallel to or substantially parallel to the second direction DR2, but the present disclosure is not limited thereto, and at least one of the dam parts DM1, DM2, or DM3, or at least a portion of at least one selected from among the dam parts DM1, DM2, or DM3 may be arranged extending in the first direction DR1, so as to surround (e.g., around a periphery of) the active region DA.

Figure 9:
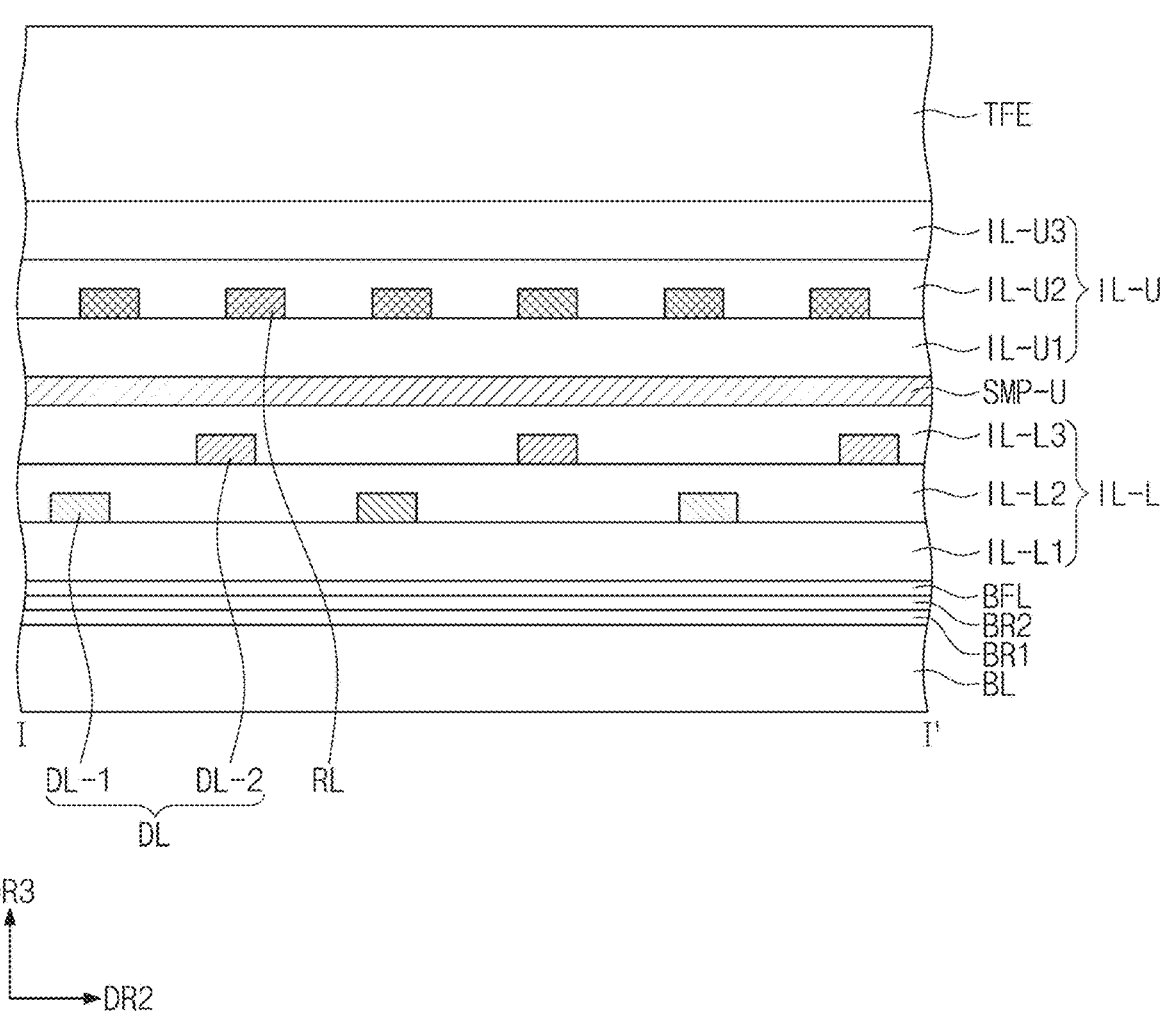
FIG. 9 is an enlarged cross-sectional view illustrating a portion of a display panel according to an embodiment of the present disclosure.
Figure 10:
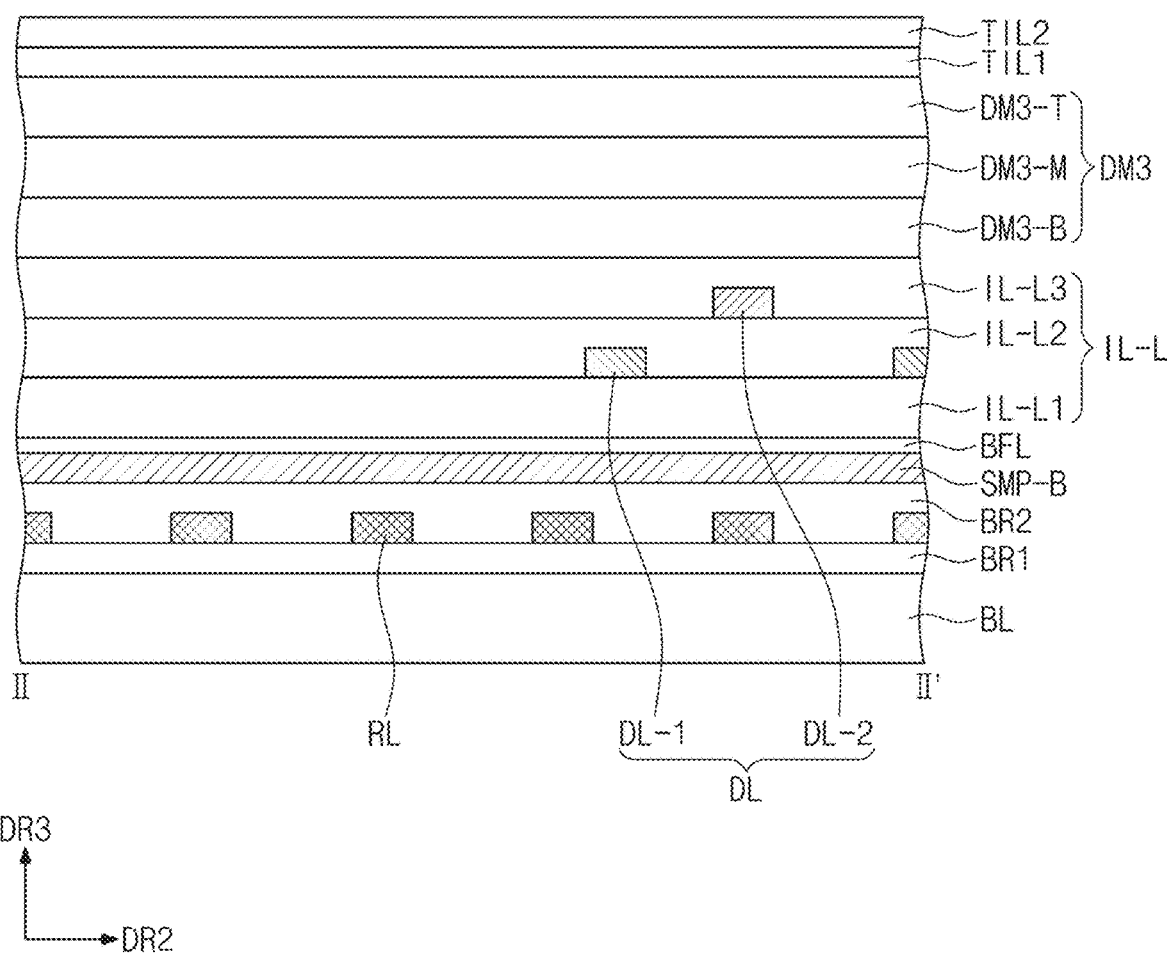
FIG. 10 is an enlarged cross-sectional view illustrating a portion of a display panel according to an embodiment of the present disclosure.
Figure 11:
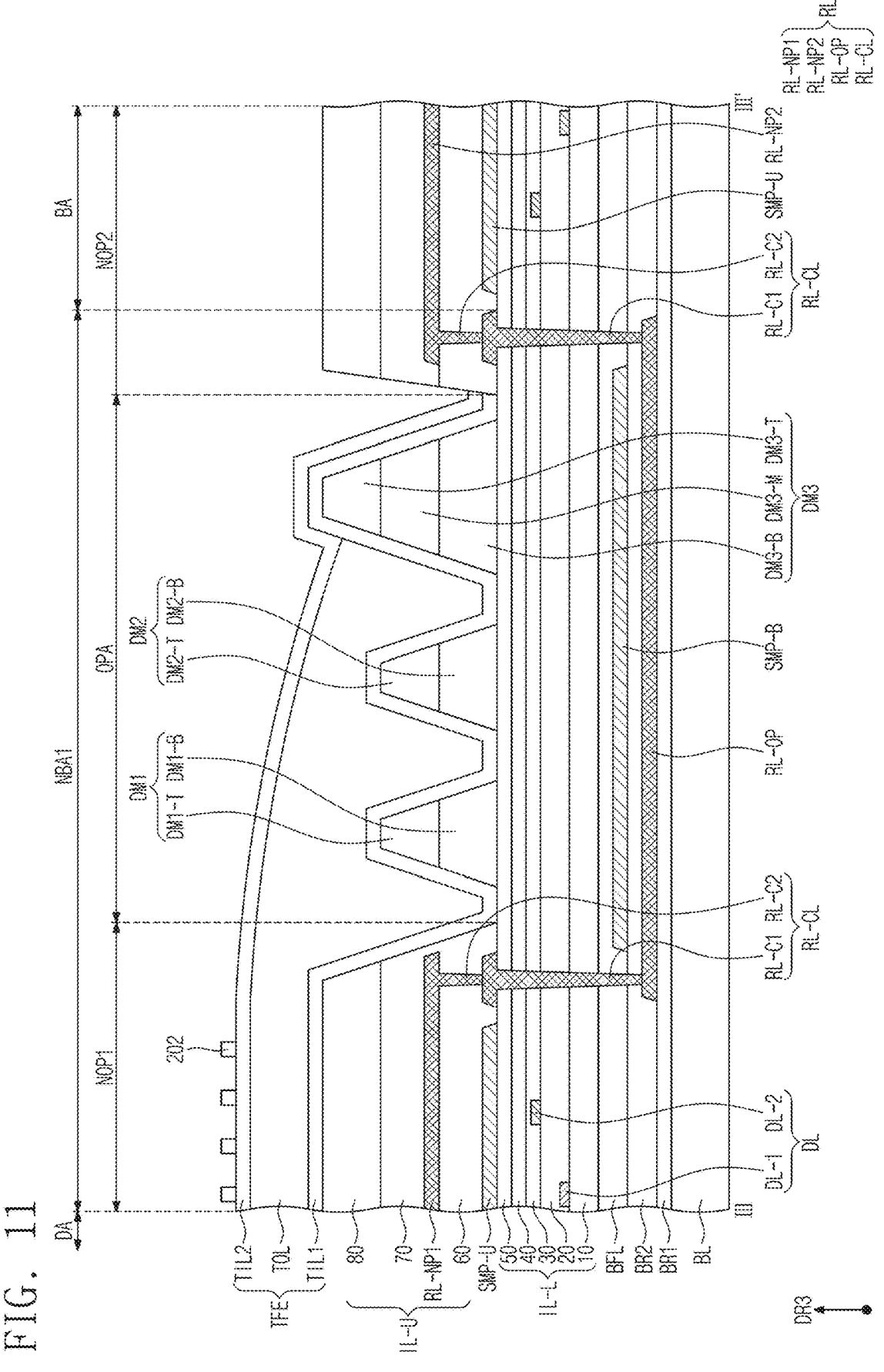
FIG. 11 is an enlarged cross-sectional view illustrating a portion of a display panel according to an embodiment of the present disclosure.

FIGS. 9 through 11 are each an enlarged cross-sectional view illustrating a portion of a display panel according to an embodiment of the present disclosure. FIG. 9 may be a cross-sectional view taken along the line I-I' of FIG. 8. FIG. 10 may be a cross-sectional view taken along the line II-II' of FIG. 8. FIG. 11 may be a cross-sectional view taken along the line III-III' of FIG. 8.

FIG. 9 is a cross-sectional view showing an arrangement of the data line DL and the sensing line RL in the non-open region NOP (e.g., see FIG. 8). FIG. 10 is a cross-sectional view showing an arrangement of the data line DL and the sensing line RL in the open region OPA (e.g., see FIG. 8). FIG. 11 corresponds to a cross-sectional view of a portion of the display panel taken along one sensing line RL extending from the active region DA to the peripheral region NDA.

Referring to FIGS. 9 to 11, in an embodiment, the sensing line RL disposed in the peripheral region NDA may be disposed below (e.g., under) the data line DL in the open region OPA, and may be disposed above the data line DL in the first region NOP1 and the second region NOP2, which are the non-open region. A display device according to an embodiment may include the sensing line RL disposed using a conductive pattern that is disposed at (e.g., in or on) a different layer from that of the data line DL in the open region OPA in which the upper insulating layer IL-U that includes organic insulating layers is removed. The data line DL and the sensing line RL may be effectively arranged in a limited space in the second direction DR2 in the open region OPA by using conductive patterns disposed at (e.g., in or on) the same layers as those of respective conductive patterns disposed at (e.g., in or on) different layers from each other in the circuit layer DP_CL. In other words, even in the open region OPA in which the organic insulating layers are removed, it may not be necessary to use conductive patterns of the same layer as that of the data line DL for the sensing line RL, and accordingly, the sensing line RL may be disposed regardless of an arrangement position of the data line DL. Accordingly, a space for the sensing line RL to be disposed may be sufficiently ensured. Thus, because the space for arrangement of the sensing line RL may be sufficiently ensured, the number of the sensing elements OPD (e.g., see FIG. 6) and the number of the sensing lines RL that may be disposed in the active region DA may be increased, and thus, a sensing ability of the display device may be further improved.

In an embodiment, one or more shielding patterns SMP-U and SMP-B may be disposed in the peripheral region NDA of the display device. The shielding patterns SMP-U and SMP-B may be disposed between the data line DL and the sensing line RL. The shielding patterns SMP-U and SMP-B may be a shielding layer that prevents or substantially prevents a coupling between two adjacent conductive patterns.

The shielding pattern may include a lower shielding pattern SMP-B disposed below (e.g., under) a lower insulating layer IL-L or in the lower insulating layer IL-L to correspond to the open region OPA, and an upper shielding pattern SMP-U disposed above the lower insulating layer IL-L or in the upper insulating layer IL-U to correspond to the first region NOP1 and the second region NOP2, which are the non-open region.

For example, in an embodiment, the sensing line RL, the lower shielding pattern SMP-B, and the data line DL may be disposed in that order in the third direction DR3 in the open region OPA. In addition, the data line DL, the upper shielding pattern SMP-U, and the sensing line RL may be disposed in that order in the third direction DR3 in the first region NOP1 and the second region NOP2, which are the non-open region.

FIG. 9 may be a cross-sectional view showing a portion of the display panel in the first region NOP1. However, the arrangement form of the data line DL and the sensing line RL and the arrangement form of the upper shielding pattern SMP-U in the second region NOP2 may be the same or substantially the same as those in the first region NOP1 described above, and thus, redundant description thereof may not be repeated.

Referring to FIG. 9, the display panel may include the lower insulating layer IL-L and the upper insulating layer IL-U sequentially disposed on the base layer BL. The upper insulating layer IL-U may be a layer including an organic material. An encapsulation layer TFE may be disposed on the upper insulating layer IL-U.

The lower insulating layer IL-L may include a first lower insulating layer IL-L1, a second lower insulating layer IL-L2, and a third lower insulating layer IL-L3, which are sequentially disposed in the third direction DR3. The upper insulating layer IL-U may include a first upper insulating layer IL-U1, a second upper insulating layer IL-U2, and a third upper insulating layer IL-U3, which are sequentially disposed in the third direction DR3. FIG. 9 illustrates that the lower insulating layer IL-L and the upper insulating layer IL-U each have a triple-layered structure, but the present disclosure is not limited thereto, and the lower insulating layer IL-L and the upper insulating layer IL-U may each have a double-layered structure or a structure including four or more layers.

The first lower insulating layer IL-L1, the second lower insulating layer IL-L2, and the third lower insulating layer IL-L3 included in the lower insulating layer IL-L may each include an inorganic material. For example, the first lower insulating layer IL-L1, the second lower insulating layer IL-L2, and the third lower insulating layer IL-L3 may each include at least one of aluminum oxide, titanium oxide, silicon oxide, silicon nitride, silicon oxynitride, zirconium oxide, or hafnium oxide.

The first upper insulating layer IL-U1, the second upper insulating layer IL-U2, and the third upper insulating layer IL-U3 included in the upper insulating layer IL-U may each include an organic material. For example, the first upper insulating layer IL-U1, the second upper insulating layer IL-U2, and the third upper insulating layer IL-U3 may each include a general-purpose polymer, such as benzocyclobutene (BCB), polyimide, hexamethyldisiloxane (HMDSO), polymethylmethacrylate (PMMA), or polystyrene (PS), a polymer derivative having a phenol-based group, an acrylic polymer, an imide-based polymer, an arylether-based polymer, an amide-based polymer, a fluorine-based polymer, a p-xylene-based polymer, a vinyl alcohol-based polymer, and/or a suitable blend thereof.

The lower insulating layer IL-L and the upper insulating layer IL-U illustrated in FIG. 9 may each correspond to at least any one insulating layer from among the first insulating layer 10 to the eighth insulating layer 80 described above with reference to FIG. 6. For example, in an embodiment, the first lower insulating layer IL-L1 may be a layer corresponding to the first insulating layer 10, and the second lower insulating layer IL-L2 may be a layer corresponding to the second insulating layer 20. In addition, the third lower insulating layer IL-L3 may be a layer corresponding to the third to fifth insulating layers 30, 40, and 50. In addition, the first upper insulating layer IL-U1 may be a layer corresponding to the sixth insulating layer 60, the second upper insulating layer IL-U2 may be a layer corresponding to the seventh insulating layer 70, and the third upper insulating layer IL-U3 may be a layer corresponding to the eighth insulating layer 80. However, the present disclosure is not limited thereto.

In an embodiment, the data line DL may be disposed in the lower insulating layer IL-L. For example, the data line DL may be disposed on the first lower insulating layer IL-L1 or on the second lower insulating layer IL-L2. The data line DL may include a first layer data line DL-1 disposed on the first lower insulating layer IL-L1, and a second layer data line DL-2 disposed on the second lower insulating layer IL-L2. Either the first layer data line DL-1 or the second layer data line DL-2 may be omitted as needed or desired.

In other words, the first layer data line DL-1 may be disposed on the first insulating layer 10 (e.g., see FIG. 6), and the second layer data line DL-2 may be disposed on the second insulating layer 20. The first layer data line DL-1 may be disposed at (e.g., in or on) the same layer as that of the third electrode G1 of the first transistor T1, and the second layer data line DL-2 may be disposed at (e.g., in or on) the same layer as that of the upper electrode UE. The first layer data line DL-1 and the third electrode G1 of the first transistor T1 may be formed in the same process as each other, and the second layer data line DL-2 and the upper electrode UE may be formed in the same process as each other. However, the present disclosure is not limited thereto.

Referring to FIG. 9, the sensing line RL may be disposed above the lower insulating layer IL-L in the non-open region. The sensing line RL may be disposed on the first upper insulating layer IL-U1. In other words, the sensing line RL may be disposed on the sixth insulating layer 60 (e.g., see FIG. 6). The sensing line RL may be disposed at (e.g., in or on) the same layer as that of the second connection electrode CNE20. The sensing line RL and the second connection electrode CNE20 may be formed in the same process as each other. However, the present disclosure is not limited thereto.

The upper shielding pattern SMP-U may be disposed between the data line DL and the sensing line RL in the third direction DR3. In an embodiment as illustrated in FIG. 9, the upper shielding pattern SMP-U may be disposed on the lower insulating layer IL-L. The upper shielding pattern SMP-U may be disposed on the third lower insulating layer IL-L3. In an embodiment, the upper shielding pattern SMP-U may be disposed on the fifth insulating layer 50 (e.g., see FIG. 6). The upper shielding pattern SMP-U may be disposed at (e.g., in or on) the same layer as that of the first connection electrode CNE10. The upper shielding pattern SMP-U and the first connection electrode CNE10 may be formed in the same process as each other, but the present disclosure is not limited thereto.

An arrangement position of the upper shielding pattern SMP-U is not limited to that illustrated in FIG. 9, and the upper shielding pattern SMP-U may be included in the lower insulating layer IL-L or the upper insulating layer IL-U between the data line DL and the sensing line RL. The upper shielding pattern SMP-U may be disposed below (e.g., under) the organic insulating layers 60, 70, and 80 (e.g., see FIG. 6), or at (e.g., in or on) the same layer as that of the organic insulating layer 60 adjacent to the inorganic insulating layers 10, 20, 30, 40, and 50 among the organic insulating layers 60, 70, and 80.

FIG. 9 illustrates that the insulating layers IL-L3 and IL-U1, which are each one layer, are respectively disposed between the data line DL and the upper shielding pattern SMP-U and between the sensing line RL and the upper shielding pattern SMP-U, but the present disclosure is not limited thereto. At least one insulating layer may be additionally disposed between the data line DL and the upper shielding pattern SMP-U and/or between the sensing line RL and the upper shielding pattern SMP-U. An insulating layer may be added, and thus, a generation of a coupling between the sensing line RL and the data line DL may be further reduced, and it may be possible to suppress a noise phenomenon.

FIG. 10 may be a cross-sectional view showing a portion of the display panel in the open region OPA. FIG. 10 is a cross-sectional view taken along the line II-II' of FIG. 8 illustrating an arrangement form of the data line DL and the sensing line RL in a portion overlapping with the dam part DM3. However, the arrangement form of the data line DL and the sensing line RL illustrated in FIG. 10, except the arrangement of the dam part DM3, may be equally applied to another region in which the dam part DM1, DM2, and DM3 is not disposed.

Referring to FIG. 10, the display panel may include the lower insulating layer IL-L disposed on the base layer BL in the open region. The upper insulating layer IL-U (e.g., see FIG. 9) may not be included in the open region. The encapsulation layer TFE (e.g., see FIG. 9) may be disposed on the lower insulating layer IL-L. FIG. 10 selectively illustrates a region in which inorganic encapsulation layers TIL1 and TIL2 among the encapsulation layer are disposed, and an organic encapsulation layer TOL may also be disposed in a portion of the open region in addition to the inorganic encapsulation layers TIL1 and TIL2.

Referring to FIG. 10, the lower insulating layer IL-L may include the first lower insulating layer IL-L1, the second lower insulating layer IL-L2, and the third lower insulating layer IL-L3, which are sequentially disposed in the third direction DR3. FIG. 10 illustrates that the lower insulating layer IL-L has a triple-layered structure, but the present disclosure is not limited thereto, and the lower insulating layer IL-L may have a double-layered structure or a structure of four or more layers. The same description as the description made above with reference to FIG. 9 and/or the like may be applied to the lower insulating layer IL-L.

A third dam part DM3 may include a plurality of layers that are sequentially stacked. The third dam part DM3 may have layers corresponding to the first upper insulating layer IL-U1 (e.g., see FIG. 9) and the second upper insulating layer IL-U2. In an embodiment, the third dam part DM3 may have a triple-layered structure including layers respectively corresponding to the first upper insulating layer IL-U1 and the second upper insulating layer IL-U2, and an additional layer thereon. The third dam part DM3 may include a bottom portion DM3-B, a middle portion DM3-M, and a top portion DM3-T. The bottom portion DM3-B may be a layer that includes the same material as that of the first upper insulating layer IL-U1, and is formed through the same process as that for the first upper insulating layer IL-U1. The middle portion DM3-M may be a layer that includes the same material as that of the second upper insulating layer IL-U2, and is formed through the same process as that for the second upper insulating layer IL-U2. In addition, the top portion DM3-T may include a different material from that of the upper insulating layer IL-U.

In the open region illustrated in FIG. 10, the data line DL may be disposed in the lower insulating layer IL-L. For example, the data line DL may be disposed on the first lower insulating layer IL-L1 or on the second lower insulating layer IL-L2. The data line DL may include a first layer data line DL-1 disposed on the first lower insulating layer IL-L1, and a second layer data line DL-2 disposed on the second lower insulating layer IL-L2. Either the first layer data line DL-1 or the second layer data line DL-2 may be omitted as needed or desired. In the open region, the data line DL may be disposed at (e.g., in or on) the same layer as that in the non-open region described above with reference to FIG. 9. In other words, the first layer data line DL-1 may be disposed on the first insulating layer 10 (e.g., see FIG. 6), and the second layer data line DL-2 may be disposed on the second insulating layer 20 (e.g., see FIG. 6). The first layer data line DL-1 and the third electrode G1 of the first transistor T1 may be disposed at (e.g., in or on) the same layer as each other, and the second layer data line DL-2 and the upper electrode UE may be disposed at (e.g., in or on) the same layer as each other.

In the open region illustrated in FIG. 10, the sensing line RL may be disposed below (e.g., under) the lower insulating layer IL-L. In an embodiment, the sensing line RL may be disposed below (e.g., under) the buffer layer BFL. For example, the sensing line RL may be disposed on the first barrier layer BR1. The sensing line RL and the first bottom metal layer BMC1 may be disposed at (e.g., in or on) the same layer as each other. The sensing line RL and the first bottom metal layer BMC1 may be formed in the same process as each other, but the present disclosure is not limited thereto.

In the open region, the lower shielding pattern SMP-B may be disposed above the sensing line RL. The lower shielding pattern SMP-B may be disposed between the sensing line RL and the data line DL in the third direction DR3. The lower shielding pattern SMP-B may be disposed below (e.g., under) the inorganic insulating layers 10, 20, 30, 40, and 50 (e.g., see FIG. 6), or between the inorganic insulating layers 10, 20, 30, 40, and 50.

In an embodiment as illustrated in FIG. 10, the lower shielding pattern SMP-B may be disposed on the second barrier layer BR2. The lower shielding pattern SMP-B may be disposed below (e.g., under) the lower insulating layer IL-L, and in an embodiment, the lower shielding pattern SMP-B may be covered with the buffer layer BFL. In other words, the lower shielding pattern SMP-B may be disposed below (e.g., under) the inorganic insulating layers 10, 20, 30, 40, and 50 (e.g., see FIG. 6).

However, the arrangement position of the lower shielding pattern SMP-B is not limited to that illustrated in FIG. 10, and the lower shielding pattern SMP-B may be included in the lower insulating layer IL-L between the sensing line RL and the data line DL, or may be disposed between other inorganic layers below (e.g., under) the lower insulating layer IL-L.

Unlike that illustrated in FIG. 10, at least one insulating layer may be additionally disposed between the sensing line RL and the data line DL, in addition to the illustrated insulating layers and/or inorganic layers. An insulating layer may be added, and thus, a generation of a coupling between the sensing line RL and the data line DL may be further reduced, and it may be possible to suppress a noise phenomenon.

FIG. 11 is a cross-sectional view showing a portion of a display panel taken along the line III-III' of FIG. 8. FIG. 11 illustrates a cross-sectional view along an extension direction of one sensing line RL.

Referring to FIGS. 8 and 11, the sensing line RL may extend from the active region DA to the peripheral region NDA. In addition, in the peripheral region NDA, the sensing line RL may extend from the first non-bending region NBA1 to the bending region BA. The peripheral region NDA adjacent to one side of the active region DA may include the open region OPA, the first region NOP1 disposed between the active region DA and the open region OPA, and the second region NOP2 spaced apart from the first region NOP1 with the open region OPA therebetween. The first region NOP1 and the second region NOP2 may be referred to as a non-open region. The open region OPA may be placed in the first non-bending region NBA1.

Referring to FIG. 11, in an embodiment, the sensing line RL may be placed at (e.g., in or on) different layers in the non-open region NOP1 and NOP2 and the open region OPA. In addition, in an embodiment, the data line DL may be placed at (e.g., in or on) the same layer in the non-open region NOP1 and NOP2 and the open region OPA.

The sensing line RL may be disposed on one organic insulating layer among the organic insulating layers included in the upper insulating layer IL-U in the first region NOP1 and the second region NOP2. In addition, the sensing line RL may be disposed on one inorganic layer among the inorganic layers disposed below (e.g., under) the lower insulating layer IL-L in the open region OPA. In other words, it may be impossible to form a sensing line using a conductive pattern disposed on an organic insulating layer, like in the first region NOP1 or the second region NOP2, in the open region OPA in which the upper insulating layer IL-U is removed. Thus, the sensing line RL may be formed, in the open region OPA in which the upper insulating layer IL-U is removed, using a conductive pattern included between the lower insulating layer IL-L or a conductive pattern disposed below the lower insulating layer IL-L. However, in a case in which a conductive pattern of the same layer as that of the data line DL is used as the conductive pattern between the lower insulating layer IL-L, the sensing line RL may be disposed in a remaining region other than a fan-out region of the data line, and thus, an arrangement region for the sensing line RL may be excessively limited.

However, in a display device according to an embodiment, an extension of an arrangement region for the sensing line RL may be obtained by forming the sensing line RL using a conductive pattern of the bottom metal layer BMC1 (e.g., see FIG. 6) disposed below (e.g., under) the data line DL, and spaced apart from the data line DL in a third direction DR3 with the insulating layers 10 and 20 or the inorganic layers BFL and BR2 therebetween. Accordingly, even in the open region OPA, the sensing line RL may be effectively disposed without an interference of the data line DL, and thus, the sensing lines RL sufficient in number may be introduced. Thus, in the display device according to an embodiment, the sensing line RL and/or the like may be disposed without an increase in a dead space and/or the like, regardless of the arrangement of the data line DL, and thus, the display device may have an improved sensing ability.

Referring to FIGS. 8 and 11, one or more dam parts DM1, DM2, and DM3 may be disposed in the open region OPA. A first dam part DM1, a second dam part DM2, and the third dam part DM3 may be sequentially arranged along a direction away from the active region DA. In other words, the second dam part DM2 may be disposed to be spaced apart farther from the active region DA compared to the first dam part DM1, and the first dam part DM1 may be disposed between a region in which the second dam part DM2 is disposed and the active region DA. The third dam part DM3 may be spaced apart farther from the active region DA compared to the second dam part DM2, and the second dam part DM2 may be disposed between the first dam part DM1 and the third dam part DM3.

The dam parts DM1, DM2, and DM3 may each include a plurality of layers. In an embodiment, the dam parts DM1, DM2, and DM3 may include a double-layered structure or a triple-layered structure. The first dam part DM1 and the second dam part DM2 may respectively include bottom portions DM1-B and DM2-B and top portions DM1-T and DM2-T. As described above with reference to FIG. 10, the third dam part DM3 may include the bottom portion DM3-B, the middle portion DM3-M, and the top portion DM3-T.

The first dam part DM1 and the second dam part DM2 may have the same or substantially the same height as each other. The first dam part DM1 and the second dam part DM2 may each have a layer corresponding to at least one among the upper insulating layer IL-U described above. The first dam part DM1 and the second dam part DM2 may each have a layer corresponding to the sixth insulating layer 60 (e.g., a first upper insulating layer) and the seventh insulating layer 70 (e.g., a second upper insulating layer). In an embodiment, the first dam part DM1 and the second dam part DM2 may each have a double-layered structure including layers respectively corresponding to the first upper insulating layer IL-U1 (e.g., see FIG. 9) and the second upper insulating layer IL-U2 (e.g., see FIG. 9). The bottom portions DM1-B and DM2-B may be a layer that includes the same material as that of the first upper insulating layer IL-U1 (e.g., see FIG. 9), and is formed through the same process as that for the first upper insulating layer IL-U1. The top portions DM1-T and DM2-T may be a layer that includes the same material as that of the second upper insulating layer IL-U2 (e.g., see FIG. 9), and is formed through the same process as that for the second upper insulating layer IL-U2.

The third dam part DM3 may have a greater height than each of the first dam part DM1 and the second dam part DM2. The same description as the description made with reference to FIG. 10 may be applied to the third dam part DM3.

A gap (e.g., a predetermined gap) may be defined between the plurality of dam parts DM1, DM2, and DM3. A valley structure may be formed between the plurality of dam parts DM1, DM2, and DM3, and in a region adjacent to the plurality of dam parts DM1, DM2, and DM3. The dam parts DM1, DM2, and DM3 may be disposed in the peripheral region NDA of the display panel DP, and an overflow of the organic encapsulation layer TOL included in the encapsulation layer TFE may be prevented through the valley structure that is defined between the dam parts DM1, DM2, and DM3 and adjacent to the dam parts DM1, DM2, and DM3.

Referring to FIG. 11, the encapsulation layer TFE may be disposed in the first region NOP1 and the open region OPA. A portion of the encapsulation layer TFE may be disposed in the open region OPA. The encapsulation layer TFE may cover the light-emitting element ED (e.g., see FIG. 6) and the sensing element OPD as described above, and may include two inorganic encapsulation layers TIL1 and TIL2 and the organic encapsulation layer TOL disposed therebetween.

The first sensor conductive layer 202 included in the sensor layer 200 (e.g., see FIG. 6) may be disposed on the encapsulation layer TFE. The first sensor conductive layer 202 may correspond to, for example, at least one among the first trace lines 231 and/or the second trace lines 232 described above. In some embodiments, a sensor base layer may be further disposed between the encapsulation layer TFE and the first sensor conductive layer 202.

Referring to FIG. 11, the sensing line RL may include a first sensing line part RL-NP1 and a third sensing line part RL-NP2 disposed in the non-open region NOP (e.g., see FIG. 8), and a second sensing line part RL-OP disposed in the open region OPA. The first sensing line part RL-NP1 and the third sensing line part RL-NP2 may be referred to as an upper sensing line part, and the second sensing line part RL-OP may be referred to as a lower sensing line part. The upper sensing line part RL-NP1 and RL-NP2 may be disposed in the non-open region NOP (e.g., see FIG. 8), and the lower sensing line part RL-OP may be disposed in the open region OPA.

The first sensing line part RL-NP1 may be disposed in the first region NOP1, and the third sensing line part RL-NP2 may be disposed in the second region NOP2. The sensing line RL may include a connection line part RL-CL connecting between the first sensing line part RL-NP1 and the second sensing line part RL-OP to each other, and between the third sensing line part RL-NP2 and the second sensing line part RL-OP. The connection line part RL-CL may be formed by passing through a portion of the circuit layer DP_CL (e.g., see FIG. 6). The connection line part RL-CL may be disposed in the non-open region, that is the first region NOP1 and the second region NOP2.

The connection line part RL-CL may include a first connection portion RL-C1 passing through (e.g., penetrating) the lower insulating layer IL-L and partially disposed on the lower insulating layer IL-L, and a second connection portion RL-C2 disposed on the first connection portion RL-C1 and passing through (e.g., penetrating) a portion of the upper insulating layer IL-U.

Referring to FIG. 11, the first connection portion RL-C1 may be disposed in a contact hole that is formed by passing through (e.g., penetrating) the inorganic insulating layers 10, 20, 30, 40, and 50, the buffer layer BFL, and the second barrier layer BR2. In addition, a portion of the first connection portion RL-C1 connected to the second connection portion RL-C2 may be disposed on the fifth insulating layer 50. For example, in an embodiment, a portion of the first connection portion RL-C1 and the upper shielding pattern SMP-U may be placed at (e.g., in or on) the same layer.

In other words, one sensing line RL may be formed to connect conductive patterns placed on different layers in the open region OPA and the non-open region NOP1 and NOP2, while extending from the active region DA to the peripheral region NDA. In an embodiment, the sensing line RL may include the first sensing line part RL-NP1 that is formed with a conductive pattern disposed between organic insulating layers, the connection line part RL-CL connected to the first sensing line part RL-NP1 and passing through (e.g., penetrating) the insulating layers and inorganic layer, the second sensing line part RL-OP connected to the first sensing line part RL-NP1 through the connection line part RL-CL and formed with a conductive pattern disposed below the lower insulating layer IL-L, the connection line part RL-CL connected to the second sensing line part RL-OP and passing through (e.g., penetrating) the insulating layers and inorganic layer, and the third sensing line part RL-NP2 connected to the second sensing line part RL-OP through the connection line part RL-CL and formed with a conductive pattern disposed between the organic insulating layers.

In addition, in an embodiment, the sensing line RL may be formed using a conductive pattern of the same layer as that of the bottom metal layer BMC1 (e.g., see FIG. 6) in at least a partial region in the first non-bending region NBA1 before the bending region BA. In more detail, the sensing line RL may be formed using a conductive pattern of the same layer as that of the bottom metal layer BMC1 (e.g., see FIG. 6) in the open region OPA that is defined between the bending region BA and the active region DA, and thus, a degree of freedom of the arrangement of the sensing line RL may be increased, while a dead space between the bending region BA and the active region DA is minimized or reduced.

In a display device according to an embodiment, sensing lines may be disposed regardless of an arrangement form of a data line by forming a sensing line electrically connected to a sensing element in an open region, in which organic insulating layers are removed, among a peripheral region using a conductive pattern placed below a data line electrically connected to a light-emitting element, and thus, the display device may show excellent sensing ability. In addition, because the sensing lines may overlap with the data lines in the open region, a dead space may be reduced, thereby increasing an area size of an active region.

A display device according to an embodiment may allow a sensing line to be more easily arranged regardless of the arrangement of a data line even in an open region by including the sensing line disposed at (e.g., in or on) a different layer from that of the data line in the open region in which organic insulating layers are removed, and thus, a sensing element may be sufficiently disposed, and the display device may have excellent sensing ability.

In a display device according to an embodiment, because a sensing line may be disposed as a different conductive layer from that of a data line in an open region in which organic insulating layers are removed, sensing lines may extend without being limited to a region other than an arrangement region for the data line, and thus, the data line and the sensing line may be more effectively arranged even in a reduced dead space.

The foregoing is illustrative of some embodiments of the present disclosure, and is not to be construed as limiting thereof. Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display device having an active region, a wiring region on at least one side of the active region, and a pad region adjacent to the wiring region, the display device comprising:

a base layer;

a circuit layer comprising:

a buffer layer on the base layer;

a plurality of inorganic insulating layers on the buffer layer;

a plurality of organic insulating layers on the inorganic insulating layers; and a plurality of conductive patterns;

an element layer on the circuit layer, and comprising a sensing element and a light-emitting element in the active region;

a data line electrically connected to the light-emitting element, and extending from the active region to the wiring region; and a sensing line electrically connected to the sensing element, and extending from the active region to the wiring region, wherein the wiring region comprises:

a first region adjacent to the active region;

a second region adjacent to the pad region; and an open region between the first region and the second region, and not including the organic insulating layers, and wherein the sensing line is located above the data line in the first region and the second region, and the sensing line is located under the data line in the open region.

2. The display device of claim 1, wherein the sensing line comprises:

a first sensing line part above the inorganic insulating layers in the first region;

a second sensing line part under the inorganic insulating layers in the open region;

a third sensing line part above the inorganic insulating layers in the second region; and a connection line part connecting between the first sensing line part and the second sensing line part, and connecting between the second sensing line part and the third sensing line part.

3. The display device of claim 2, wherein the first sensing line part and the third sensing line part are located at the same layer as each other between the organic insulating layers, and wherein the second sensing line part is located under the buffer layer.

4. The display device of claim 2, wherein the circuit layer further comprises a lower shielding pattern overlapping with the second sensing line part, and located between the second sensing line part and the data line in the open region.

5. The display device of claim 4, wherein the lower shielding pattern is located under the inorganic insulating layers, or between the inorganic insulating layers.

6. The display device of claim 2, wherein the circuit layer further comprises an upper shielding pattern between the sensing line and the data line in the first region and the second region.

7. The display device of claim 6, wherein the upper shielding pattern is located under the organic insulating layers, or at the same layer as that of an organic insulating layer adjacent to the inorganic insulating layers among the organic insulating layers.

8. The display device of claim 2, wherein the connection line part comprises a first connection portion penetrating at least one of the organic insulating layers, and a second connection portion penetrating the inorganic insulating layers.

9. The display device of claim 2, wherein the data line is located between the inorganic insulating layers.

10. The display device of claim 1, wherein in the active region, the conductive patterns comprise:

a transistor;

a capacitor;

a bottom metal layer under the transistor and overlapping with the transistor; and a plurality of connection electrodes electrically connected to the light-emitting element or the sensing element, and located between the organic insulating layers, and wherein in the wiring region, the conductive patterns comprise the data line and the sensing line.

11. The display device of claim 10, wherein in the wiring region, the data line is located at the same layer as that of any one electrode of the transistor or any one electrode of the capacitor.

12. The display device of claim 11, wherein in the wiring region, the data line comprises:

a first layer data line on a first inorganic insulating layer in the first region, the open region, and the second region; and a second layer data line on a second inorganic insulating layer on the first inorganic insulating layer in the first region, the open region, and the second region.

13. The display device of claim 10, wherein in the open region, the sensing line is located at the same layer as that of the bottom metal layer.

14. The display device of claim 10, wherein in the first region and the second region, the sensing line is located at the same layer as that of any one of the connection electrodes.

15. The display device of claim 1, further comprising at least one dam part on the inorganic insulating layers in the open region, wherein the at least one dam part overlaps with the sensing line.

16. The display device of claim 15, wherein the at least one dam part extends in a second direction crossing a first direction extending from the active region to the wiring region.

17. The display device of claim 1, further comprising a sensor layer on the element layer, and comprising a sensor conductive layer and a sensor insulating layer.

18. The display device of claim 1, wherein the wiring region comprises a first non-bending region adjacent to the active region, a bending region bent with respect to a virtual axis extending in one direction, and a second non-bending region spaced from the first non-bending region with the bending region therebetween, and wherein the open region is included in the first non-bending region.

19. The display device of claim 18, wherein a width of the second non-bending region in the one direction is smaller than a width of the first non-bending region in the one direction.

20. An electronic device comprising:

a display layer; and a sensor layer on the display layer, wherein the display layer has an active region, a wiring region on at least one side of the active region, and a pad region adjacent to the wiring region, wherein the display layer comprises:

a base layer;

a circuit layer comprising:

a buffer layer on the base layer;

a plurality of inorganic insulating layers on the buffer layer;

a plurality of organic insulating layers on the inorganic insulating layers; and a plurality of conductive patterns;

an element layer on the circuit layer, and comprising a sensing element and a light-emitting element in the active region;

a data line electrically connected to the light-emitting element, and extending from the active region to the wiring region; and a sensing line electrically connected to the sensing element, and extending from the active region to the wiring region, wherein the wiring region comprises:

a first region adjacent to the active region;

a second region adjacent to the pad region; and an open region between the first region and the second region, and not including the organic insulating layers, wherein the sensing line is located above the data line in the first region and the second region, and the sensing line is located under the data line in the open region, and wherein the electronic device is one of a smartphone, a personal computer, a laptop, a personal digital assistant, a car navigation, a game console, a tablet PC, a camera a television, a monitor, or a billboard.

* * * * *